(12) United States Patent
Vinayak et al.

(10) Patent No.: US 11,012,055 B2
(45) Date of Patent: May 18, 2021

(54) COMPARATOR SYSTEM

(71) Applicant: Silego Technology Inc., Santa Clara, CA (US)

(72) Inventors: Vikas Vinayak, Menlo Park, CA (US); David Kuneth Chow, San Jose, CA (US); Nathan Willis John, Prescott, AZ (US); Sidney Chan, Fremont, CA (US)

(73) Assignee: Silego Technology Inc., Santa Clara, CA (US)

( * ) Notice: Subject to any disclaimer, the term of this patent is extended or adjusted under 35 U.S.C. 154(b) by 138 days.

(21) Appl. No.: 16/415,054

(22) Filed: May 17, 2019

(65) Prior Publication Data

US 2020/0366277 A1   Nov. 19, 2020

(51) Int. Cl.
| | |
|---|---|
| *H03K 3/0233* | (2006.01) |
| *H03K 5/1534* | (2006.01) |
| *H02M 1/08* | (2006.01) |
| *H02M 3/158* | (2006.01) |
| *H03K 19/20* | (2006.01) |
| *H03K 5/00* | (2006.01) |

(52) U.S. Cl.
CPC ......... *H03K 3/02337* (2013.01); *H02M 1/08* (2013.01); *H02M 3/158* (2013.01); *H03K 5/1534* (2013.01); *H03K 19/20* (2013.01); *H03K 2005/00019* (2013.01); *H03K 2005/00293* (2013.01)

(58) Field of Classification Search
CPC .. H03K 3/02337; H03K 5/1534; H03K 19/20; H03K 2005/00019; H03K 2005/00293; H02M 1/08; H02M 3/158
See application file for complete search history.

(56) References Cited

U.S. PATENT DOCUMENTS

| | | | |
|---|---|---|---|
| 2008/0180149 A1* | 7/2008 | Byun | H03L 7/0812 327/158 |
| 2018/0248483 A1* | 8/2018 | Maruyama | H02M 3/156 |
| 2020/0091819 A1* | 3/2020 | Kobayashi | H02M 3/158 |

OTHER PUBLICATIONS

"Comparator," found on Wikipedia, last edited on Mar. 9, 2019, 7 pages, https://en.wikipedia.org/wiki/Comparator.

* cited by examiner

*Primary Examiner* — Alex Torres-Rivera
(74) *Attorney, Agent, or Firm* — Saile Ackerman LLC; Stephen B. Ackerman

(57) ABSTRACT

A comparator system and a method for comparing an input signal and a reference signal are presented. The system has a controller to adjust a rising output delay and/or a falling output delay of a system output signal. The system output signal is dependent on the comparison between the input signal and the reference signal. This system provides a more efficient comparator with reduced power consumption whilst still providing the required rising output delay and falling output delay for a given application. Techniques used in prior art will always resort to running the comparators at a speed that supports the speed requirements in the worst case conditions and does not exploit any asymmetries in the required rising output delay and falling output delay for a given application. When these asymmetries are exploited, further increases in power efficiency can be achieved.

20 Claims, 24 Drawing Sheets

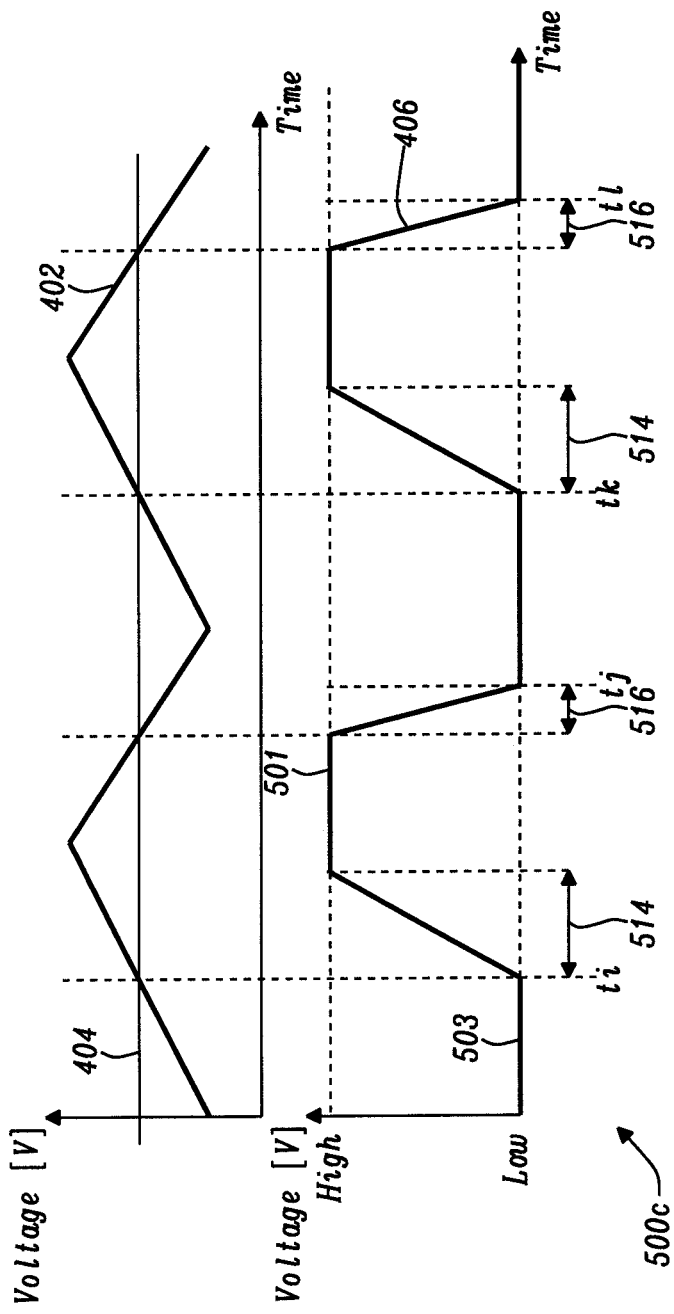

US 11,012,055 B2

COMPARATOR SYSTEM

TECHNICAL FIELD

The present disclosure relates to comparator systems and in particular, but not exclusively, to electrical comparator systems for use with switching power converters.

BACKGROUND

A comparator is a device that receives two input signals and provides an output based on a comparison between the input signals. One of the input signals may be a constant reference signal against which the other input is compared.

FIG. 1 is a schematic of a comparator 100 in accordance with the prior art. The comparator 100 has a first input for receiving an input voltage 102, a second input for receiving a reference voltage 104 and an output for providing an output voltage 106. The output voltage 106 may be in one of two states, namely: a high state or a low state.

The high state may alternatively be referred to as a high signal and the low state may alternatively be referred to as a low signal. The output voltage 106 may be equal to a supply voltage provided to the comparator 100 when the output voltage 106 is in the high state, and may be equal to zero volts (which may be referred to as ground) when in the low state.

The comparator 100 may be configured to output the output voltage 106 in the high state when the input signal 102 is larger than the reference signal 104 and may be configured to output the output voltage 106 in the low state when the input signal 102 is smaller than the reference signal 104.

The output voltage 106 transitions between states in a finite time, as illustrated in FIG. 2A.

FIG. 2A is a timing diagram 200 showing the operation of the comparator 100 of FIG. 1. The timing diagram 200 shows the input voltage 102, the reference voltage 104 and the output voltage 106. The output voltage 106 varies between the high state 201 and the low state 203 as the input voltage 102 varies with time.

Also shown is a digital output signal 210. The output voltage 106 is in effect an analog signal and its digital representation is shown by the digital output signal 210. When the output voltage 106 exceeds a threshold value, it is considered as being a digital signal having a logic value of "1" as shown by the digital output signal 210. When the output voltage 106 is below the threshold value the output voltage 106 is considered as having a logic value of "0" as shown by the digital output signal 210.

Between a time $t_0$ and a time $t_{1a}$ the input voltage 102 is lower than the reference voltage 104 and the output voltage 106 is in the low state 203. Between the time $t_{1a}$ and a time $t_{3a}$ the input voltage 102 is higher than the reference voltage 104 and the condition for the output voltage 106 to be in the high state 201 is met. At the time $t_{1a}$ the condition for the output voltage 106 to transition from the low state 203 to the high state 201 is met, however the transition does not begin until a time $t_{1b}$. The time after the low state to high state transitioning condition is met, but before the output voltage 106 transitions may be referred to as a rising delay time 205a, which is from the time $t_{1a}$ to the time $t_{1b}$. A time period 205b taken for the output voltage 106 to transition from the low state 203 to the high state 201, from the time $t1_b$ to the time $t_2$ may be referred to as a rise time 205b. A rising output delay 205 refers to the total time from the low state to the high state transitioning condition being met (at the time $t_{1a}$ when the input voltage 102 exceeds the reference voltage 104) to the point at which the output voltage 106 has completed its transition from the low state 203 to high state 201 (at the time $t_2$).

Between the time $t_{3a}$ and a time $t_{5a}$ the input voltage 102 is smaller than the reference voltage 104 and the condition for the output voltage 106 to be in the low state 203 is met. At the time $t_{3a}$ the condition for the output voltage 106 to transition from the high state 201 to the low state 203 is met, however the transition does not begin until a time $t_{3b}$. The time after the high state to low state transitioning condition is met, but before the output voltage 106 transitions may be referred to as a falling delay time 207a, which is from the time $t_{3a}$ to the time $t_{3b}$. A time period 207b taken for the output voltage 106 to transition from the high state 201 to the low state 203, from the time $t_{3b}$ to the time $t_4$ may be referred to as a fall time 207b. A falling output delay 207 refers to the total time from the high state to the low state transitioning condition being met (at the time $t_{3a}$ when the input voltage 102 falls below the reference voltage 104) and the point at which the output voltage 106 has completed its transition from the high state 201 to low state 203 (at the time $t_4$).

The rising output delay 205 may also be referred to as the response time of the leading edge and the falling output delay 207 may also be referred to as the response time of the falling edge.

The process then repeats as the input voltage 102 varies. Between a time $t_{5a}$ and a time $t_{7a}$ the input signal 102 is again higher than the reference voltage 104, therefore the condition for the output voltage 106 being in the high state 201 is met. After the time $t_{7a}$ the input voltage 102 becomes lower than the reference voltage 104 and the condition for the output voltage 106 being in the low state 203 is met until the input voltage 102 crosses the reference voltage 104 again.

FIG. 2B is a timing diagram 220 showing the operation of the comparator 100 of FIG. 1. The timing diagram 220 corresponds to the timing diagram 200 but with the rising delay time 205a and the falling delay time 207a omitted. In FIG. 2B and other timing diagrams described herein, the rising delay times and the falling delay times have been omitted to aid in the clarity of the drawings; it will be appreciated that in any practical implementation of a comparator the rising output delay and the falling output delay comprise the rising delay time and the falling delay time, respectively, despite their omission from some of the timing diagrams in the present disclosure.

The rising output delay 205 and the falling output delay 207 are intrinsic properties of a comparator, such as the comparator 100. In particular, the rising delay time 205a, the rise time 205b, the falling delay time 207a and the fall time 207b are intrinsic properties of a comparator, such as the comparator 100. In a practical system the delay times 205a, 207a are typically on the order of hundreds of nanoseconds, whereas the rise and fall times 205b, 207b are typically on the order of nanoseconds. As such the delay times 205a, 207a are typically the dominating factor for the output delays 205, 207.

Different comparators may have different rising delay times 205a, rise times 205b, falling delay times 207a and fall times 207b. The rising delay times and the falling delay times may be referred to collectively as delays, or signal delays.

FIG. 3 is a timing diagram 300 shows the output voltage 106 of the comparator 100 as previously described in FIG. 1 and FIG. 2A and FIG. 2B, in addition to an output voltage 302 of a faster comparator. The faster comparator also receives the input voltage 102 and the reference voltage 104 as previously described. The faster comparator provides the output voltage 302 having a rising output delay 304 (RT2) and a falling output delay 306 (FT2). The rising output delay 304 is shorter than the rising output delay 205 (RT1) and the falling output delay 306 is shorter than the falling output delay 207 (FT1). Therefore, the faster comparator provides an output voltage 302 that transitions between states quicker than the output voltage 106 provided by the comparator 100. The faster comparator may be said to have a faster response time than the comparator 100.

The response time of a comparator determines the applications in which the comparator can be used. In systems requiring high operating frequencies, comparators with fast response times are required. However, the power consumed by a comparator is often directly related to the speed of its response, such that faster comparators consume more power than slower comparators. Therefore, the comparator 100 has lower power consumption than the faster comparator, but the faster comparator can enable a system implementing the faster comparator to function at a higher operating frequency.

This poses a challenge for comparators that are used in high performance portable devices, where combining fast response time and low power consumption is increasingly desirable. High performance portable devices are especially challenging applications due to the fact that they have different operating modes, some of which use very little power, as an example, when the device is asleep. It is during these periods, when the native power consumption is low, that the power overhead for the comparators is most critical, and advanced techniques for extreme power efficiency are needed.

SUMMARY

It is desirable to provide a more efficient comparator with reduced power consumption whilst still providing the required rising output delay and falling output delay for a given application. Techniques used in prior art will always resort to running the comparators at a speed that supports the speed requirements in the worst case conditions and does not exploit any asymmetries in the required rising output delay and falling output delay for a given application. When these asymmetries are exploited, further increases in power efficiency can be achieved.

According to a first aspect of the disclosure there is provided a comparator system for comparing an input signal and a reference signal, comprising a controller configured to adjust a rising output delay and/or a falling output delay of a system output signal, wherein the system output signal is dependent on the comparison between the input signal and the reference signal.

Optionally, the system output signal comprises a high state and a low state, the rising output delay comprises a rising delay time and a rise time, the falling output delay comprises a falling delay time and a fall time, the rising delay time is a time taken from the comparison between the input signal and the reference signal triggering a low-to-high transition of the system output signal from the low state to the high state until the low-to-high transition begins, the rise time is a time taken for the system output signal to transition from the low state to the high state from the beginning of the low-to-high transition, the falling delay time is a time taken from the comparison between the input signal and the reference signal triggering a high-to-low transition of the system output signal from the high state to the low state until the high-to-low transition begins, and the fall time is a time taken for the system output signal to transition from the high state to the low state from the beginning of the high-to-low transition.

Optionally, the rising output delay is the sum of the rising delay time and the rise time, and the falling output delay is the sum of the falling delay time and the fall time.

Optionally, the controller is configured to adjust the rising output delay and the falling output delay of the system output signal such that i) the rising output delay is less than the falling output delay, or ii) the falling output delay is less than the rising output delay, or iii) the rising output delay and the falling output delay are equal.

Optionally, the controller is configured to adjust the rising output delay and/or the falling output delay of the system output signal based on a signal received from one of i) a memory element configured to store data related to the rising output delay and/or the falling output delay of the system output signal, wherein the signal received from the memory element is dependent on the data stored within the memory element, or ii) at least a portion of an electrical circuit, wherein the signal received by the controller is dependent on one or more requirements of the at least a portion of the electrical circuit.

Optionally, the controller is configured to adjust the rising output delay and/or the falling output delay of the system output signal based on the signal received from the at least a portion of the electrical circuit, and the comparator system is implemented within the electrical circuit.

Optionally, the comparator system comprises a comparator configured to receive the input signal and the reference signal, and provide the system output signal.

Optionally, the comparator is coupled to the controller and the controller is configured to adjust the rising output delay and/or the falling output delay of the system output signal.

Optionally, the controller is configured to adjust the rising output delay and/or the falling output delay of the system output signal by doing at least one of adjusting a first supply voltage provided to the comparator, adjusting a bias current provided to the comparator, and enabling and/or disabling components of the comparator.

Optionally, the comparator is a hysteretic comparator.

Optionally, the comparator system comprises a plurality of comparators, wherein each comparator is configured to i) receive the input signal and the reference signal, and ii) provide a comparator output signal, wherein each of the comparator output signals have different rising output delays and/or falling output delays, the controller is configured to adjust the rising output delay and/or falling output delay of the system output signal by selectively enabling or disabling at least one of the comparators, and the system output signal comprises the comparator output signal provided by a comparator that is enabled.

Optionally, the comparator system comprises one or more logic gates, wherein each of the comparator output signals are provided to the, or each, logic gate, and the, or each, logic gate outputs the system output signal, such that the system output signal comprises the comparator output signal provided by a comparator that is enabled.

Optionally, the, or each, logic gate is an OR gate.

Optionally, at least one of the comparators is a hysteretic comparator.

Optionally, the plurality of comparators comprises a first comparator and a second comparator.

Optionally, the controller is configured to receive the comparator output signal from the first comparator, and to enable or disable the second comparator based on the received comparator output signal from the first comparator.

Optionally, the controller comprises an RC circuit comprising a first capacitor and a resistor and having an RC time constant, and the controller is configured to discharge the RC circuit, a discharge time being dependent on the RC time constant, when the comparator output signal from the first comparator transitions from a low state to a high state, and the second comparator is disabled when the RC circuit is sufficiently discharged.

Optionally, the controller comprises an inverter and a diode, wherein the resistor comprises a first terminal coupled to a second supply voltage and a second terminal coupled to an input of the inverter at a controller node, the inverter comprises an output coupled to a power terminal of the second comparator for enabling or disabling the second comparator, the diode comprises a first terminal coupled to the controller node and a second terminal coupled to an output of the first comparator, the comparator output signal of the first comparator being provided at the output of the first comparator.

Optionally, at least one of the input signal, the reference signal and the system output signal are one of a voltage and a current.

According to a second aspect of the disclosure there is provided a switching converter for receiving a converter input voltage and providing a converter output voltage comprising a set of switches comprising one or more switches, an energy storage element configured to convert the converter input voltage to the converter output voltage by a switching operation of the set of switches, a gate driver configured to control the switching operation of the set of switches by selectively switching the, or each, switch between an open state and a closed state, and a comparator system for comparing an input signal and a reference signal, comprising a controller configured to adjust a rising output delay and/or a falling output delay of a system output signal, wherein the system output signal is dependent on the comparison between the input signal and the reference signal, wherein the input signal provided to the comparator system is the output voltage of the switching converter, the system output signal is provided to the gate driver, and the gate driver is enabled or disabled based on the system output signal provided to the gate driver and/or the switching operation of the set of switches is dependent on the system output signal provided to the gate driver.

Optionally, the set of switches comprises a first switch and a second switch, wherein the first switch, the second switch and the energy storage element are configured to convert the converter input voltage to the converter output voltage by the switching operation of the first switch and the switching operation of the second switch, the gate driver is configured to control the switching operation of the first and second switches by selectively switching the first and second switches between an open state and a closed state, and the gate driver is enabled or disabled based on the system output signal provided to the gate driver and/or the switching operation of the first and second switches are dependent on the system output signal provided to the gate driver.

Optionally, the switching converter is a buck converter and the energy storage element is an inductor.

Optionally, a first terminal of the first switch, a first terminal of the second switch and a first terminal of the inductor are coupled at an inductor node, a second terminal of the first switch is coupled to converter input voltage, a second terminal of the second switch is coupled to ground, and a second terminal of the inductor is coupled to an output node, the converter output voltage being provided at the output node.

Optionally, the switching converter comprises an output capacitor coupled to the output node.

Optionally, the switching converter comprises decision making circuitry configured to receive the system output signal and to provide the system output signal to the gate driver to enable or disable the gate driver when in a first mode and to provide the system output signal to the gate driver to control the switching operation of the set of switches when in a second mode.

Optionally, the switching converter comprises a state machine configured to receive the system output signal and to process and output the system output signal to the gate driver, wherein the processing is based on the history of the comparator system's or the switching converter's operation.

It will be appreciated that the switching converter of the second aspect may include providing and/or using features set out in the first aspect and can incorporate other features as described herein.

According to a third aspect of the disclosure there is provided a method of comparing an input signal and a reference signal using a comparator system comprising a controller, the method comprising adjusting a rising output delay and/or a falling output delay of a system output signal using the controller, wherein the system output signal is dependent on the comparison between the input signal and the reference signal.

It will be appreciated that the method of the third aspect may include providing and/or using features set out in the first aspect and can incorporate other features as described herein.

According to a fourth aspect of the disclosure there is provided a method of providing a switching converter for receiving a converter input voltage and providing a converter output voltage comprising providing a set of switches comprising one or more switches, providing an energy storage element configured to convert the converter input voltage to the converter output voltage by a switching operation of the set of switches, providing a gate driver configured to control the switching operation of the set of switches by selectively switching the, or each, switch between an open state and a closed state, and providing a comparator system for comparing an input signal and a reference signal, comprising a controller configured to adjust a rising output delay and/or a falling output delay of a system output signal, wherein the system output signal is dependent on the comparison between the input signal and the reference signal, wherein the input signal provided to the comparator system is the output voltage of the switching converter, the system output signal is provided to the gate driver, and the gate driver is enabled or disabled based on the system output signal provided to the gate driver and/or the switching operation of the set of switches is dependent on the system output signal provided to the gate driver.

It will be appreciated that the method of the fourth aspect may include providing and/or using features set out in the second aspect and can incorporate other features as described herein.

BRIEF DESCRIPTION OF THE DRAWINGS

The disclosure is described in further detail below by way of example and with reference to the accompanying drawings, in which:

FIG. 5C is a timing diagram showing the operation of a specific embodiment of the comparator system in accordance with a fourth embodiment of the present disclosure;

DESCRIPTION

Figure 4:
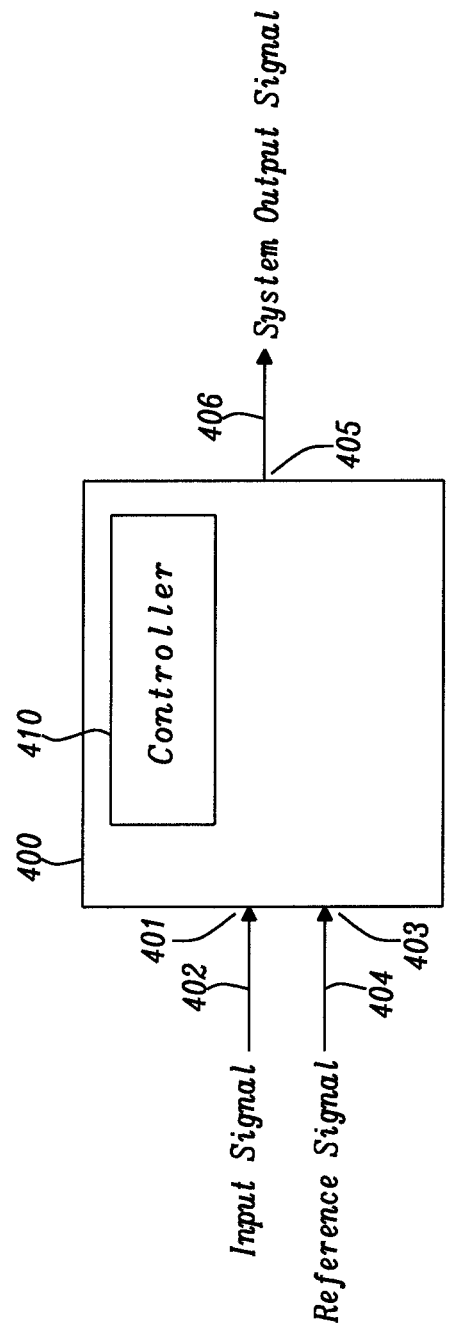
FIG. 4 is a schematic of a comparator system in accordance with a first embodiment of the present disclosure.

FIG. 4 is a schematic of a comparator system 400 in accordance with a first embodiment of the present disclosure. The comparator system 400 is suitable for comparing an input signal 402 and a reference signal 404. The comparator system 400 is configured to provide a system output signal 406 that is dependent on the comparison between the input signal 402 and the reference signal 404. The comparator system 400 comprises a controller 410, a first input 401 for receiving the input signal 402, a second input 403 for receiving the reference signal 404 and an output 405 for providing the system output signal 406. The system output signal 406 comprises a high state and a low state.

The controller 410 is configured to adjust a rising output delay and/or a falling output delay of the system output signal 406.

The rising output delay comprises a rising delay time and a rise time. The falling output delay comprises a falling delay time and a fall time. The rising delay time is a time taken from the comparison between the input signal 402 and the reference signal 404 triggering a low-to-high transition of the system output signal 406 from the low state to the high state until the low-to-high transition begins. The rise time is a time taken for the system output signal 406 to transition from the low state to the high state from the beginning of the low-to-high transition. The falling delay time is a time taken from the comparison between the input signal 402 and the reference signal 404 triggering a high-to-low transition of the system output signal 406 from the high state to the low state until the high-to-low transition begins. The fall time is a time taken for the system output signal 406 to transition from the high state to the low state from the beginning of the high-to-low transition.

The rising output delay may be the sum of the rising delay time and the rise time and the falling output delay may be the sum of the falling delay time and the fall time.

It will be appreciated that the comparator system 400 may adjust the rising output delay by adjusting one or both of the rise time and the rising delay time, and may adjust the falling output delay by adjusting one or both of the fall time and the falling delay time.

The comparator system 400 may be configured to output the system output signal 406 in the high state when the input signal 402 is larger than the reference signal 404 and may be configured to output the system output signal 406 in the low state when the input signal 402 is smaller than the reference signal 404.

At least one of the input signal 402, the reference signal 404 and the system output signal 406 may be one of a voltage and a current. In the present embodiment all of the signals 402, 404, 406 are voltages and therefore the comparator system 400 is an example of a voltage comparator. Voltage comparators are a common type of comparator used in electronic circuits and are generally configured to compare two input voltages and return an output voltage as described for the comparator 100 in FIG. 1.

It will be appreciated that in further embodiments the comparator system 400 may alternatively receive temperatures or currents as the input signal 402 and the reference signal 404. Furthermore, the system output signal 406 may be a current or a voltage. The inputs provided to the comparator system 400 and the output provided by the comparator system 400 will be dependent on the application.

The timing diagrams 300 of the prior art comparators (the comparator 100 and the faster comparator) show approximately symmetric signal delays, where the rising output delay is equal to the falling output delay. For each cycle of operation, the comparator 100 and the faster comparator have unchanging symmetric rising and falling output delays. Compared with the prior art, the comparator system 400, and in particular the controller 410, of the present disclosure provides a means for adjusting the rising and/or falling output delays.

Figure 5A:
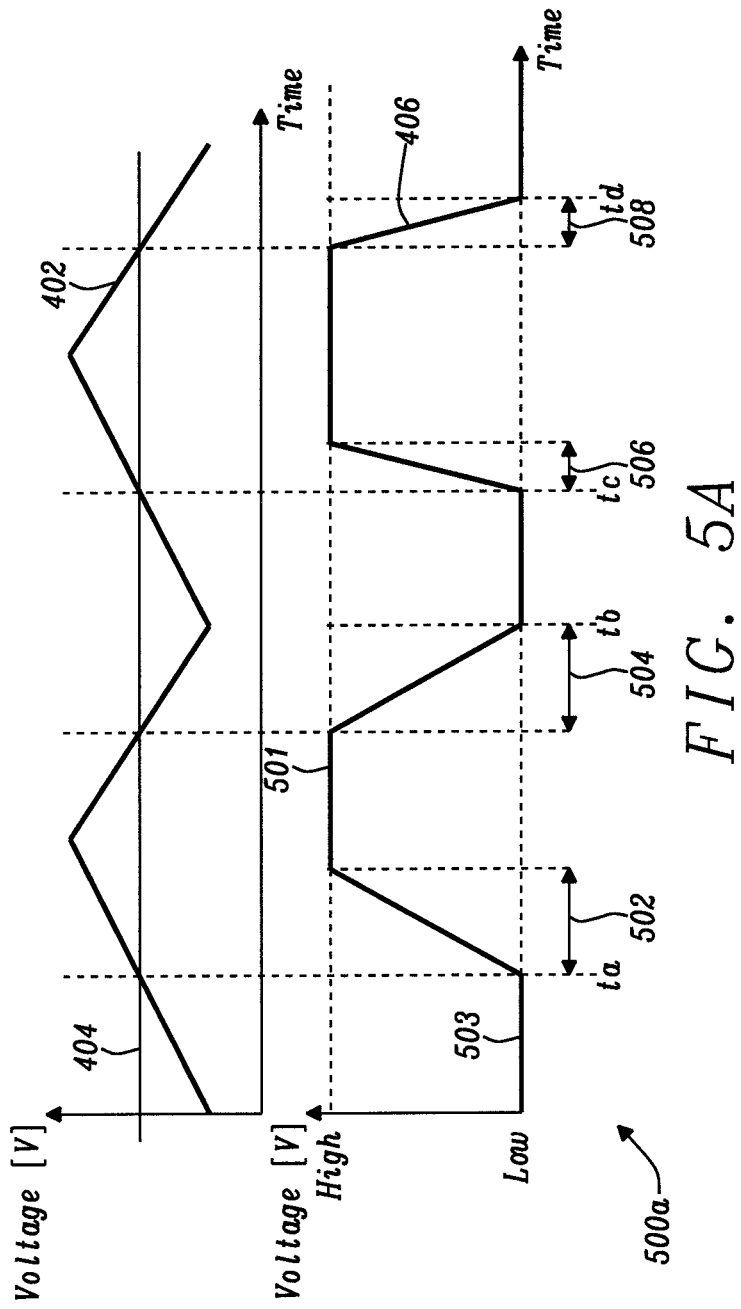
FIG. 5A is a timing diagram showing the operation of a specific embodiment of the comparator system in accordance with a second embodiment of the present disclosure.

FIG. 5A is a timing diagram 500a showing the operation of a specific embodiment of the comparator system 400 in accordance with a second embodiment of the present disclosure. In this specific embodiment, the controller 410 is configured to adjust the rising output delay and the falling output delay of the system output signal 406 such that the rising output delay and the falling output delay are approximately equal. The timing diagram 500a therefore illustrates a symmetrical mode of operation. The system output signal 406 varies between a high state 501 and a low state 503. As discussed previously, the rising and falling delay times have been omitted to aid in the clarity of the drawings, and in a physical implementation of the comparator system 400 the rising output delay will comprise the rise time and the rising delay time, and the falling output delay will comprise the fall time and the falling delay time. Between a time ta and a time tb the system output signal 406 has a first rising output delay 502 that is equal to a first falling output delay 504. At a time tc the controller 410 adjusts the rising and falling output delays. Between the time tc and a time td, the system output signal 406 has a second rising output delay 506 and a second falling output delay 508. The second rising output delay 506 and the second falling output delay 508 are equal and are shorter than the first rising output delay 502 and the first falling output delay 504. Therefore, a symmetrical mode of operation is maintained throughout. It is possible to adjust the rising and falling output delays with each transition of the system output signal 406, whilst still maintaining the symmetrical mode of operation. Between the time ta and the time tb, the comparator system 400 may be said to be operating in a slow mode. Between the time tc and the time td, the comparator 400 system may be said to be operating in a fast mode. The controller 410 may be configured to switch between the fast and slow mode depending on the requirements of a higher-level system. The controller 410 may operate the comparator system 400 in the fast mode when the performance is required by the higher-level system and may transition to the slow mode (a lower power mode) when the higher-level system can tolerate the reduction in speed. The end result is a reduction of power consumption without compromising the higher-level system performance.

The higher-level system may be a system that implements the comparator system 400 and uses the system output signal 406 as part of its operation. The higher-level system may implement the comparator system 400 as part of a feedback loop.

Figure 5B:
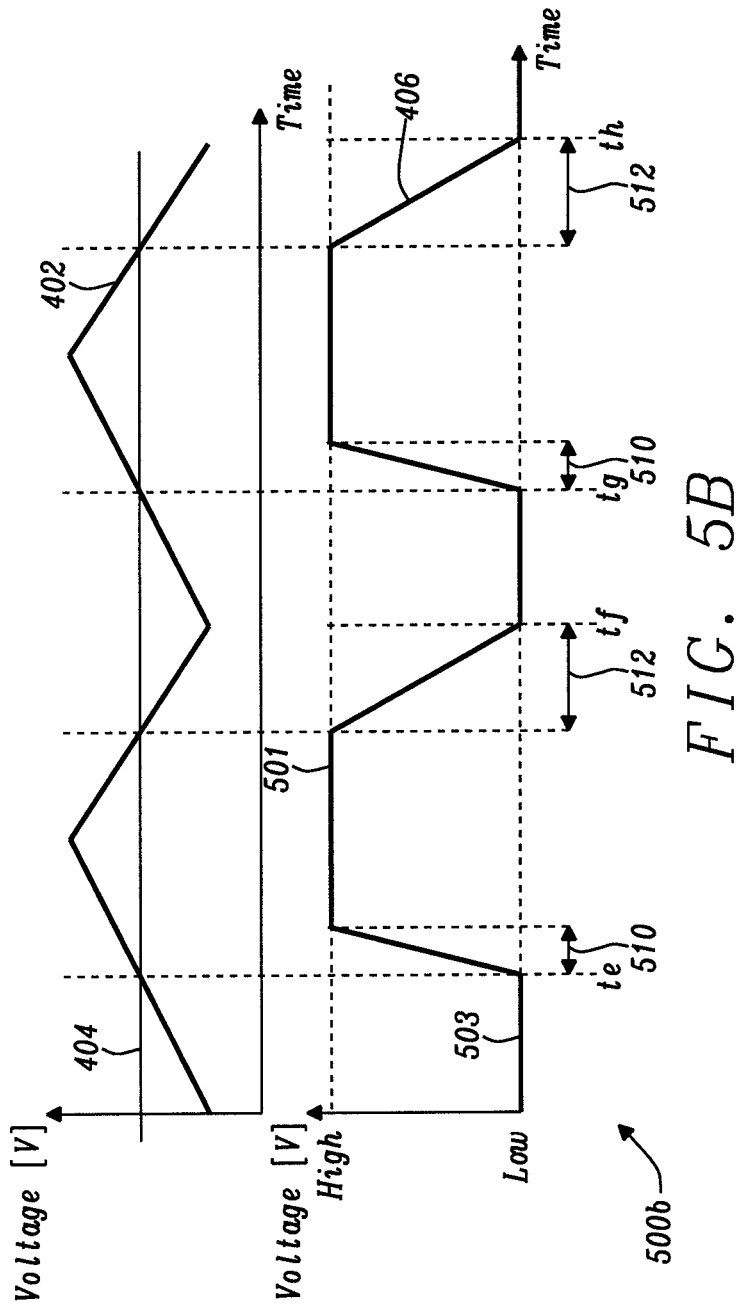
FIG. 5B is a timing diagram showing the operation of a specific embodiment of the comparator system in accordance with a third embodiment of the present disclosure.

FIG. 5B is a timing diagram 500b showing the operation of a specific embodiment of the comparator system 400 in accordance with a third embodiment of the present disclosure. In this specific embodiment, the controller 410 is configured to adjust the rising output delay and the falling output delay of the system output signal 406 such that the rising output delay is less than the falling output delay. The timing diagram 500b therefore illustrates an asymmetric mode of operation. Between a time te and a time tf, and between a time tg and a time th, the system output signal 406 has a rising output delay 510 that is not equal to a falling output delay 512. As discussed previously, the rising and falling delay times have been omitted to aid in the clarity of the drawings and in a physical implementation of the comparator system 400 the rising output delay will comprise the rise time and the rising delay time, and the falling output delay will comprise the fall time and the falling delay time.

FIG. 5C is a timing diagram 500c showing the operation of a specific embodiment of the comparator system 400 in accordance with a fourth embodiment of the present disclosure. In this specific embodiment, the controller 410 is configured to adjust the rising output delay and the falling output delay of the system output signal 406 such that the falling output delay is less than the rising output delay. The timing diagram 500c therefore illustrates an asymmetric mode of operation. Between a time ti and a time tj, and between a time tk and a time tl, the system output signal 406 has a rising output delay 514 that is not equal to a falling output delay 516. As discussed previously, the rising and falling delay times have been omitted to aid in the clarity of the drawings and in a physical implementation of the comparator system 400 the rising output delay will comprise the rise time and the rising delay time, and the falling output delay will comprise the fall time and the falling delay time.

It will be appreciated that one comparator system 400 may be configured to provide the functionalities described in FIGS. 5A, 5B and 5C, or alternatively multiple comparator systems 400 may be used to provide one or more of the functionalities. Additionally, the comparator system 400 may be configured to switch between the different functionalities described in FIGS. 5A, 5B and 5C depending on the requirements of the application/system and may adapt to changes in the application/system.

As previously mentioned, the power consumption of a comparator is usually related to the speed of its response, hence by operating the comparator system 400 in an asymmetrical mode, we provide a comparator with a reduced overall power consumption without compromising the performance of the comparator system 400 (and any higher-level circuit implementing the comparator system 400).

The controller 410 may be implemented using circuit components that give the desired characteristics to adjust the rising and/or falling output delays for a specific application. This may be designed in hardware and fixed during production, such that the operation of the comparator system 400 cannot be changed after it is produced. Alternatively, the controller 410 may be implemented using circuit components that can be adjusted after production, for example by using a switch or series of switches that enable a user to switch the comparator system 400 between modes. The modes may correspond to the system output signal 406 profiles as shown in FIGS. 5A, 5B and 5C.

Figure 6A:
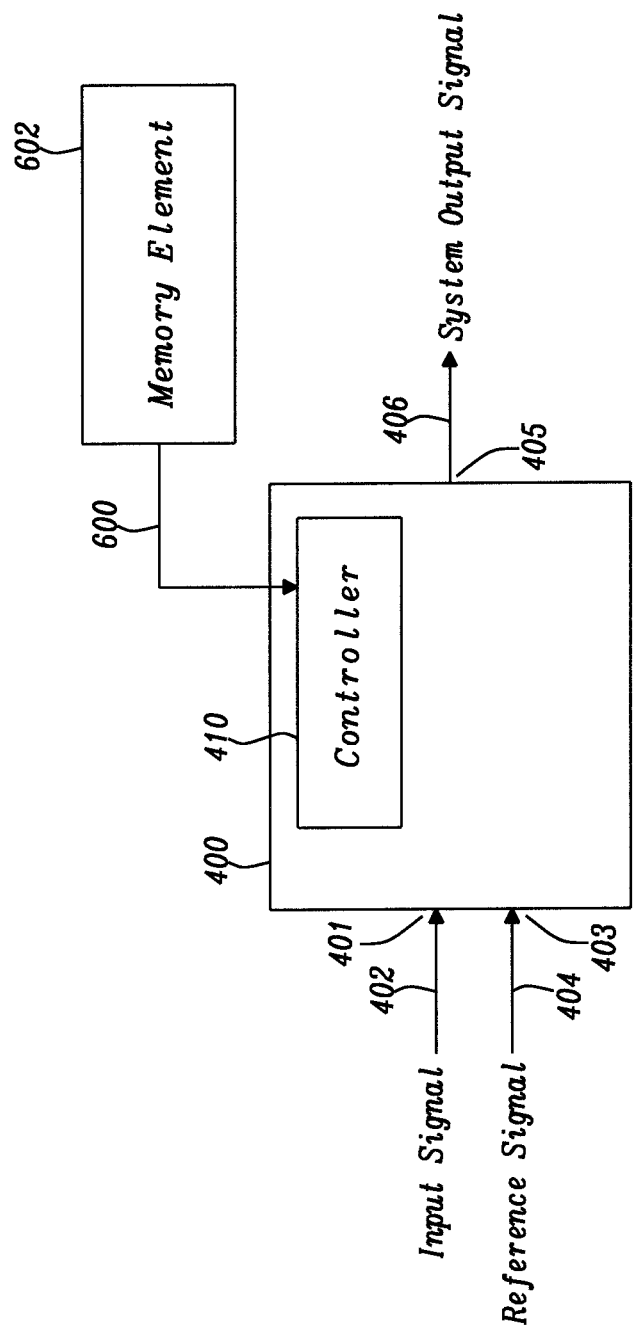
FIG. 6A is a schematic of a specific embodiment of the comparator system in accordance with a fifth embodiment of the present disclosure.

FIG. 6A is a schematic of a specific embodiment of the comparator system 400 in accordance with a fifth embodiment of the present disclosure. Common features between figures share common reference numerals or variables.

The controller 410 of the comparator system 400 is coupled to a memory element 602. In the present embodiment, the controller 410 is configured to adjust the rising output delay and/or falling output delay of the system output signal 406 based on a signal 600 received from the memory element 602. The memory element 602 is configured to store data related to the rising and/or falling output delays of the system output signal and the signal 600 received from the memory element 602 is dependent on the data stored within the memory element 602.

The data may be pre-loaded into the memory element 602 prior to operation of the comparator system 400 or it might be loaded into the memory element 602 during operation. The data might be updated during the operation of the comparator system 400.

It will be appreciated that although the memory element 602 is illustrated outside the comparator system 400 in this drawing, in some embodiments the memory element 602 could be embedded within the comparator system 400 or within the controller 410 itself.

Figure 6B:
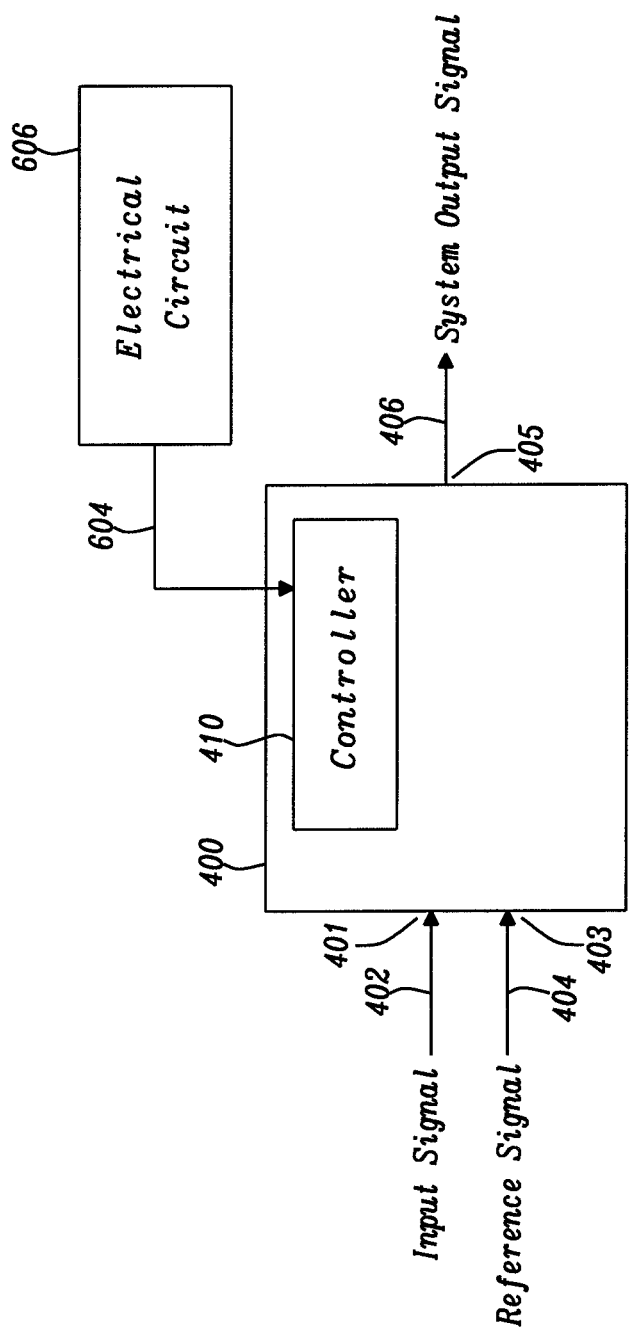
FIG. 6B is a schematic of a specific embodiment of the comparator system in accordance with a sixth embodiment of the present disclosure.

FIG. 6B is a schematic of a specific embodiment of the comparator system 400 in accordance with a sixth embodiment of the present disclosure. Common features between figures share common reference numerals or variables.

In the present embodiment the controller 410 is coupled to an electrical circuit 606 and is configured to adjust the rising output delay and/or falling output delay of the system output signal 406 based on a signal 604 received from the electrical circuit 606. The signal 604 is dependent on a requirement of the electrical circuit 606. For example, the electrical circuit 606 may be making use of the system output signal 406 and require that for one mode of operation, the rising output delay is faster than the falling output delay. The signal 604 provided by the electrical circuit 606 can be used to instruct the controller 410 to adjust the rising and/or falling output delays accordingly. This may be the case where the electrical circuit 606 can tolerate a slow falling output delay but requires a fast rising output delay.

In an additional embodiment the signal 604 may be received from a portion of the electrical circuit 606. In a further embodiment the adjustment of the rising and/or falling output delays may be based on more than one requirement of the electrical circuit 606.

It will be appreciated that although in this specific embodiment the electrical circuit 606 is external to the comparator system 400, however in some other embodiments the electrical circuit 606 could be a circuit or a portion of a circuit embedded within the comparator system 400 or within the controller 410 itself.

Figure 6C:
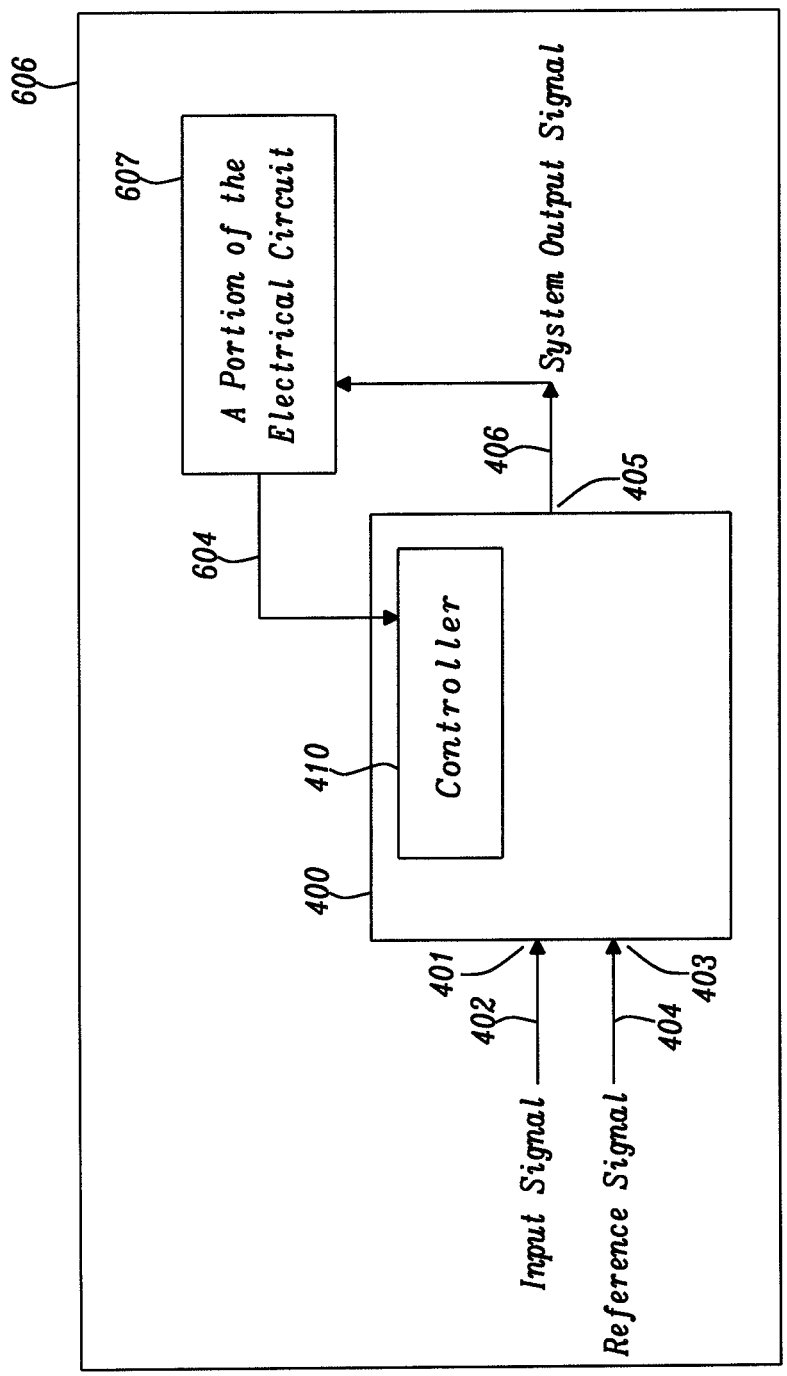
FIG. 6C is a schematic of a specific embodiment of the comparator system in accordance with a seventh embodiment of the present disclosure.

FIG. 6C is a schematic of a specific embodiment of the comparator system 400 in accordance with a seventh embodiment of the present disclosure. Common features between figures share common reference numerals or variables.

In the present embodiment, the comparator system 400 is implemented within the electrical circuit 606. A portion 607 of the electrical circuit 606 may receive the system output signal 406 and provide the signal 604 to the controller 410 based on the system output signal 406 received. As such, a feedback loop is formed and the signal 604 functions as a feedback signal.

The controller 410 allows the comparator system 400 to operate in an adaptive manner. The comparator system 400 may be embedded in or coupled to a higher-level circuit (for example the electrical circuit 606) and the controller 410 may be configured to operate the comparator system 400 in an adaptive manner that satisfies the requirements of the higher-level circuit. The operating characteristics of the comparator system 400 may be determined by the system requirements of the higher-level system. For example, if the higher-level system requires a comparator function to have a fast rising output delay, but can tolerate a slow falling output delay, the comparator system 400 will operate a low power, "slow mode" during a portion of the time, reducing the over-all power consumption of the comparator system 400.

Figure 7A:
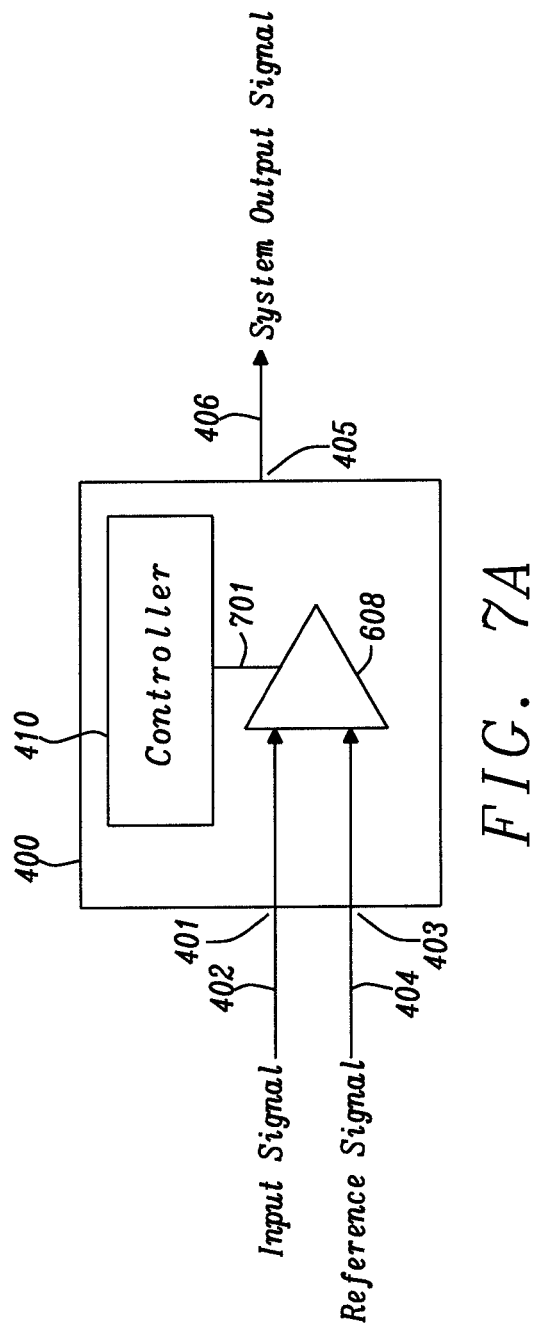
FIG. 7A is a schematic of a specific embodiment of the comparator system in accordance with an eighth embodiment of the present disclosure.

FIG. 7A is a schematic of a specific embodiment of the comparator system 400 in accordance with an eighth embodiment of the present disclosure. Common features between figures share common reference numerals or variables.

In this specific embodiment the comparator system 400 comprises a comparator 608 that is configured to receive the input signal 402 and the reference signal 404, and to provide the system output signal 406.

The comparator 608 is coupled to the controller 410 and the controller 410 is configured to adjust the rising output delay and/or falling output delay of the system output signal by providing a control signal 701 to the comparator 608.

The control signal 701 may act to adjust a supply voltage provided to the comparator 608. As the rising and/or falling output delay of a comparator is dependent on the comparator's supply voltage, the rising and/or falling output delay may be adjusted by varying the supply voltage. Therefore, the supply voltage may be adjusted to provide the system output signal 406 as shown in one of FIGS. 5A, 5B and 5C. For example, the controller 410 may adjust the supply voltage to a lower value when a slow response (either falling or rising output delay) time is tolerated and boost the supply voltage to the comparator 608 when a faster response time is required. It will be appreciated that the control signal 701 may be the supply voltage or may be any other signal suitable for adjusting the supply voltage in accordance with the understanding of the skilled person.

Alternatively, the control signal 701 may act to adjust a bias current provided to the comparator 608. As the rising and/or falling output delay of a comparator is dependent on the comparator's bias current, the rising and/or falling output delay may be adjusted by varying the bias current. Therefore, the bias current may be adjusted to provide the system output signal 406 as shown in one of FIGS. 5A, 5B and 5C. It will be appreciated that the control signal 701 may be the bias current or may be any other signal suitable for adjusting the bias current in accordance with the understanding of the skilled person.

Alternatively, the control signal 701 may act to enable and/or disable components of the comparator 608. The components of the comparator 608, may for example, be transistors implemented within the comparator 608. Enabling and/or disabling these components may be used to adjust the rising and/or falling output delays.

In a further embodiment, the comparator 608 may be a hysteretic comparator that uses a different threshold voltage depending on whether the system output signal 406 is transitioning from the low state to the high state or from the high state to the low state.

Figure 7B:
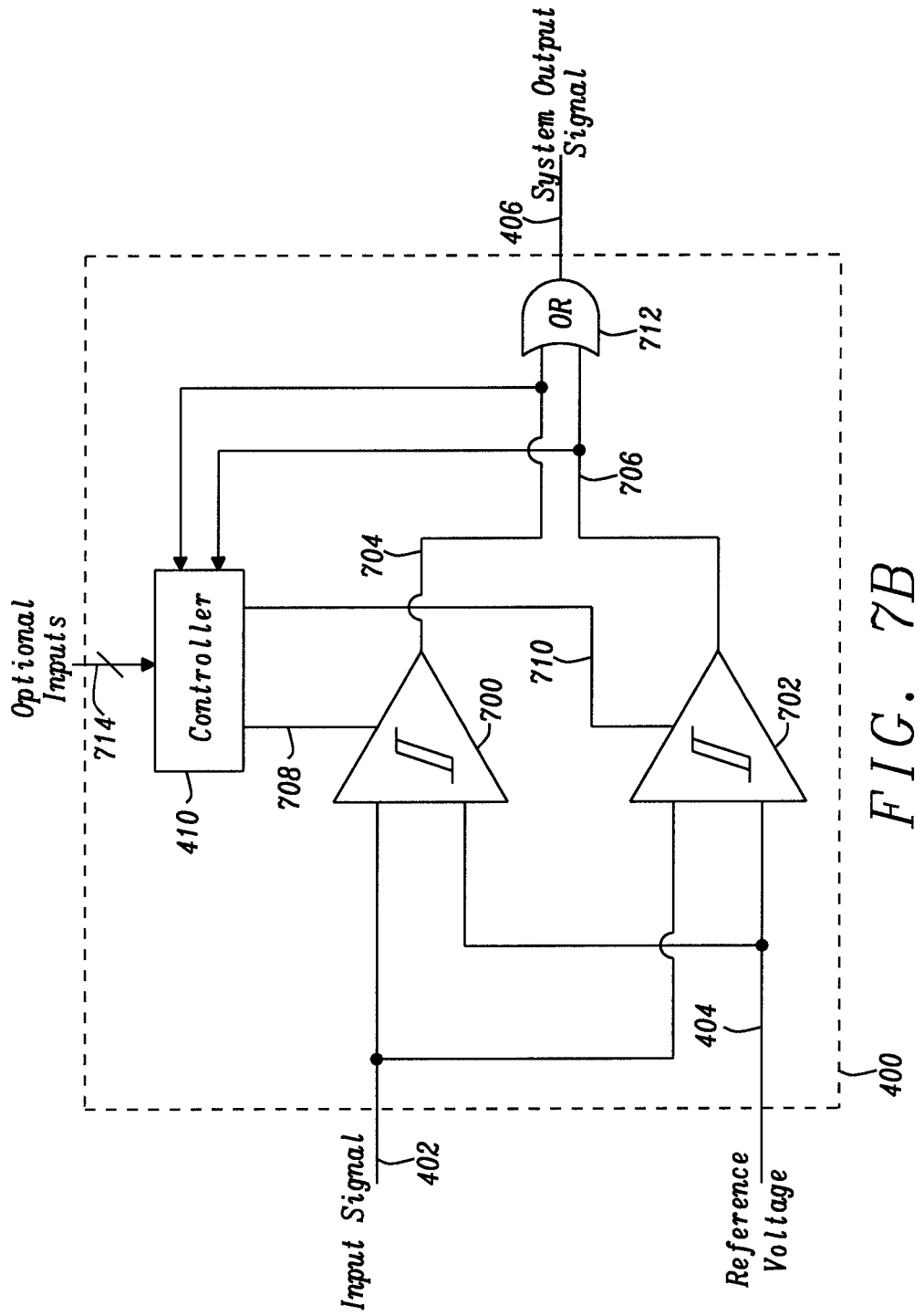
FIG. 7B is a schematic of a specific embodiment of the comparator system in accordance with a ninth embodiment of the present disclosure.

FIG. 7B is a schematic of a specific embodiment of the comparator system 400 in accordance with a ninth embodiment of the present disclosure. Common features between figures share common reference numerals or variables.

The comparator system 400 comprises a plurality of comparators 700, 702. In the present embodiment the plurality of comparators comprises a comparator 700 and a comparator 702. It will be appreciated that in further embodiments the plurality of comparators 700, 702 may comprise more than two comparators and the operation of an embodiment of the comparator system 400 comprising more than two comparators will be clear to the skilled person. At least one of the comparators 700, 702 may be a hysteretic comparator.

It will be appreciated that the present embodiment is a specific example of the comparator 608 as previously described, where the internal components, in effect, correspond to two or more comparators within the comparator 608. Enabling and/or disabling the components using the control signal 701 corresponds to enabling and/or disabling individual comparators.

Each comparator 700, 702 is configured to receive the input signal 402 and the reference signal 404, and to provide a comparator output signal 704, 706. The comparator 700 has a first input for receiving the input signal 402, a second input for receiving the reference voltage 404 and an output for providing the comparator output signal 704. The comparator 702 has a first input for receiving the input signal 402, a second input for receiving the reference voltage 404 and an output for providing the comparator output signal 706.

Each of the comparator output signals 704, 706 have different rising output delays and/or falling output delays. The controller 410 is configured to adjust the rising output delay and/or falling output delay of the system output signal 406 by selectively enabling or disabling at least one of the comparators 700, 702. The comparator 700 comprises a third input for receiving a control signal 708 from the controller 410 and the comparator 702 comprises a third input for receiving a control signal 710 from the controller 410. The control signals 708, 710 act to enable or disable their respective comparators 700, 702.

The system output signal 406 comprises the comparator output signal provided by a comparator that is enabled. For example, in the present embodiment, the comparator 702 exhibits a faster rising and falling output delay than the comparator 700 and therefore the comparator 702 will have a higher power consumption than the comparator 700. If the comparator system 400 requires a fast response due to the requirements of an external system, then the controller 410 will disable the comparator 700 and the comparator 702 will be enabled and provide the system output signal 406. If the external system no longer requires a fast response, then the controller 410 will disable the comparator 702 and enable the comparator 700 so that the system output signal 406 is provided by the comparator 700. The controller 410 may function to provide the system output signal 406 as shown in any of FIG. 5A, 5B or 5C, or any combination of these characteristics in accordance with the understanding of the skilled person.

In a preferred embodiment, to reduce power consumption compared with the prior art, the aim may be to limit an operating duty cycle of the comparator 702 and enable it only when fast rising and/or falling output delay is required. This reduces overall power consumption, without compromising higher-level system performance. For example, the higher-level system may require a low comparator delay when transitioning from the high state to the low state but tolerate a slower response when transitioning from the low state to the high state, or vice versa.

Furthermore, the comparator system 400 may operate in a mode where a fast response time is required for both a transition from the high state to the low state and the low state to the high state, and in a mode whereby a fast response time is not required for either a transition from the high state to the low state nor the low state to the high state.

The comparator system 400 may comprise one or more logic gates where each of the comparator output signals 704, 706 are provided to the, or each, logic gate. The, or each, logic gate is configured such that the system output signal 406 is provided at an output, where the system output signal 406 comprises the comparator output signal 704, 706 provided by a comparator that is enabled.

In a specific embodiment, the comparator system 400 comprises an OR gate 712. Each of the comparator output signals 704, 706 are provided to the OR gate 712 and the OR gate 712 outputs the system output signal 406, such that the system output signal 406 comprises the comparator output signal 704, 706 provided by the comparator 700, 702 that is enabled. As a disabled comparator will in effect provide a comparator output signal in the low state, the OR gate 712 will output the comparator output signal provided by the enabled comparator as the system output signal 406.

The OR gate 712 has a first input for receiving the comparator output signal 704, a second input for receiving the comparator output signal 706 and an output for providing the system output signal 406 of the comparator system 400.

The controller 410 may comprise a first input for receiving the comparator output signal 704 and a second input for receiving the second comparator output signal 706. This enables the controller 410 to adjust the rising and/or falling output delays of the system output signal 406 based on the comparator output signals 704, 706. The controller 410 may comprise one or more additional inputs for receiving other signals 714 to adjust the operation of the controller 410 and therefore the comparator system 400. For example, these other signals 714 may be received from the electrical circuit 606 or the memory element 602 as described previously. Alternatively, the other signals 714 may be received from an external source or a user to provide user-control. For example, when the comparator system 400 is implemented in a higher-level system (such as the electrical circuit 606 shown in FIG. 6C), the higher-level system may have a high performance mode and a low power mode. In the high performance mode, a fast response by the comparator system 400 may be required for both low to high and high to low transitions. The higher-level system may signal the controller 410 to place the comparator system 400 in a high performance mode, enabling the fast response comparator (the comparator 702) at a 100% duty cycle. Conversely, in the low power mode, the higher-level system may signal the controller 410 to place the comparator system 400 in the low power mode, disabling the fast response comparator (the comparator 702) at a 0% duty cycle.

The controller 410 may enable or disable the comparators 700, 702 by adjusting a supply voltage provided to each of the comparators 700, 702. For example, if no supply voltage is provided to a comparator, then that comparator will be disabled.

When implemented as part of a higher-level circuit (such as the electrical circuit 602 as shown in FIG. 6C), the controller 410 may be configured to reduce the overall power consumption without compromising the performance of the higher-level circuit. This may be achieved by configuring the controller 410 to limit the operating duty cycle of the comparator 702 and enabling it only when a fast rising and/or falling output delay is required. For example, the higher-level system may require a fast response time when the system output signal 406 of the comparator system 400 transitions from a high state to a low state but tolerate a longer response time when the system output signal 406 of the comparator system 400 transitions from a low state to a high state (or vice versa). Alternatively, the higher-level system may require the comparator system 400 to have both a fast falling output delay and a fast rising output delay during a first phase of operation and to have a slow falling output delay and a slow rising output delay during a second phase of operation.

Figure 7C:
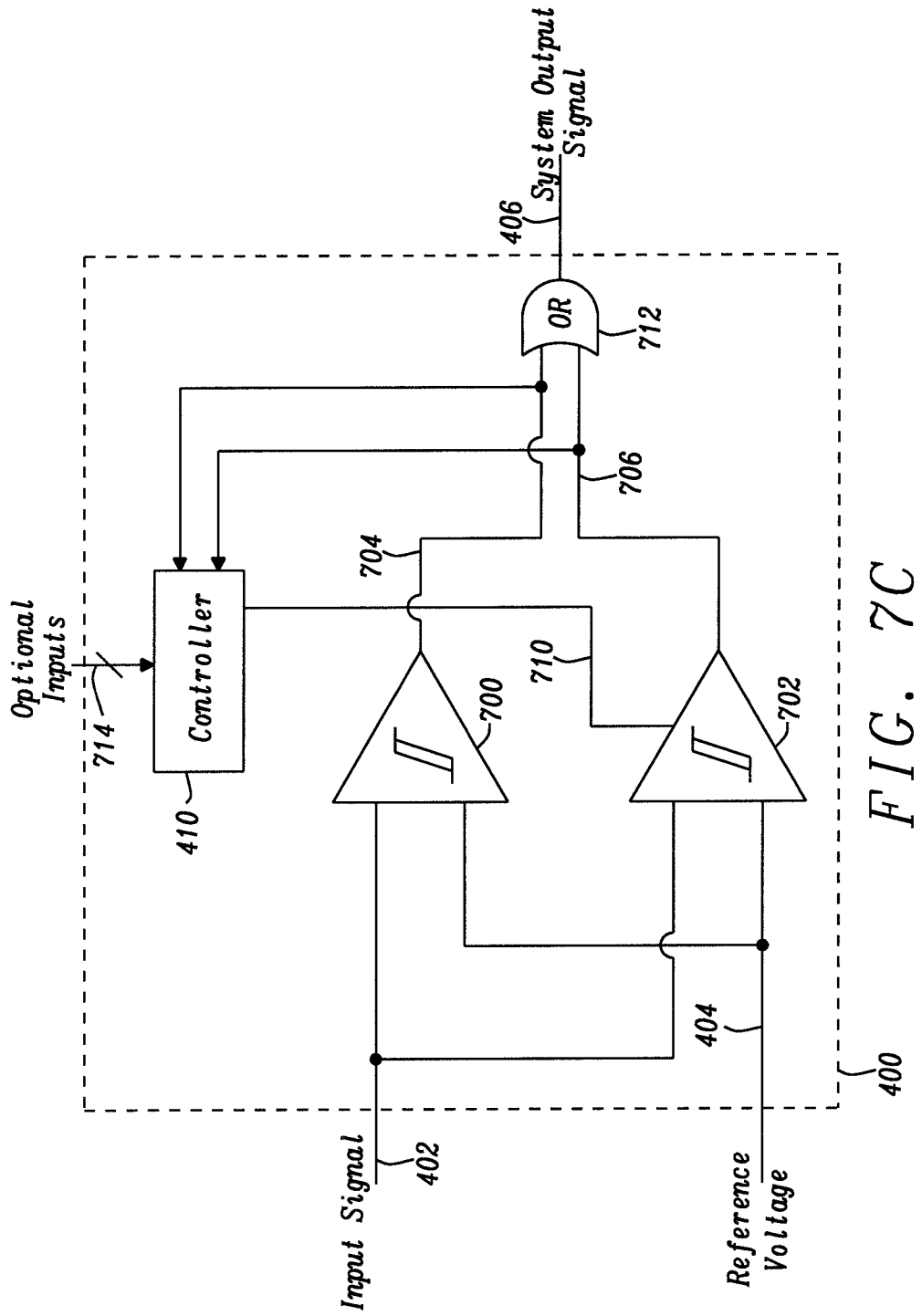
FIG. 7C is a schematic of a specific embodiment of the comparator system in accordance with a tenth embodiment of the present disclosure.

FIG. 7C is a schematic of a specific embodiment of the comparator system 400 in accordance with a tenth embodiment of the present disclosure. Common features between figures share common reference numerals or variables.

FIG. 7C corresponds to the embodiment shown in FIG. 7B, however in the present embodiment, the controller 410 does not provide the signal 708 to the comparator 700. Therefore, the comparator 700 remains enabled throughout the operation and the rising and/or falling output delays of the system output signal 406 are adjusted by enabling/disabling the comparator 702 only. In a further embodiment, the comparator 702 may not receive the control signal 710, whilst the comparator 700 receives the control signal 708.

In further embodiments comprising more than two comparators, it will be appreciated that one or more comparators may receive a signal for enabling/disabling the comparator from the controller 410, whilst the other comparators may receive no signal from the controller 410.

Figure 8:
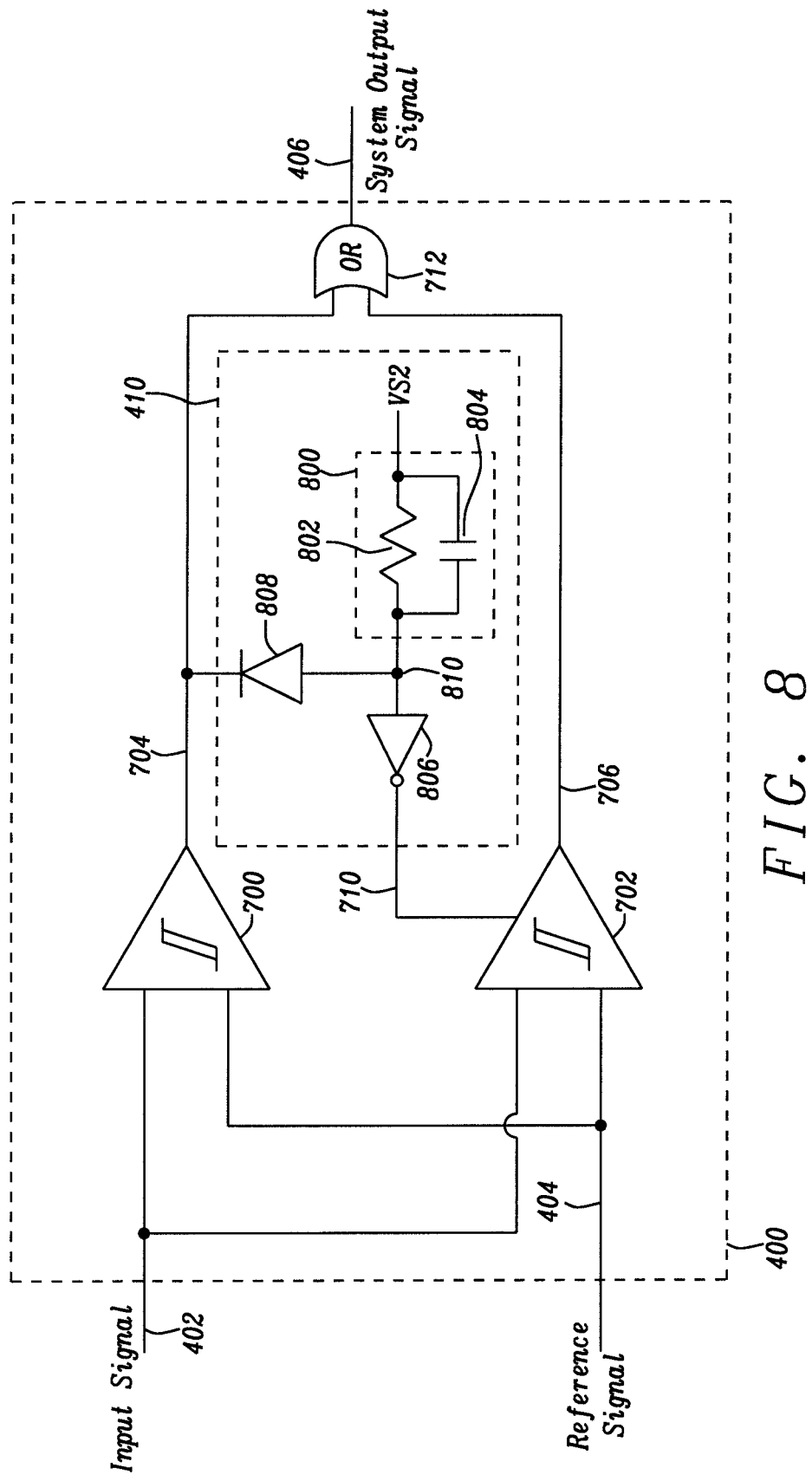
FIG. 8 is a schematic of a specific embodiment of the comparator system as shown in FIG. 7C and in accordance with an eleventh embodiment of the present disclosure.

FIG. 8 is a schematic of a specific embodiment of the comparator system 400 as shown in FIG. 7C and in accordance with an eleventh embodiment of the present disclosure. Common features between figures share common reference numerals or variables. In the present embodiments, the controller 410 is implemented using circuit components that are designed to give desired rising/falling output delay characteristics and, as discussed before, may be fixed during production or may be adjustable.

In this specific embodiment, the comparator system 400 is configured to operate with a small delay when the system output signal 406 transitions from the low state 503 to the high state 501 (fast rising output delay) and with a large delay when the output 406 transitions from the high state 501 to the low state 503 (slow falling output delay), as is shown in FIG. 5B.

Power consumption may be reduced by enabling the comparator 702 only during periods when a transition from the low state to the high state of the comparator output signal 706 is required for the system output signal 406.

The controller 410 is configured to receive the comparator output signal 704 from the comparator 700 and to enable or disable the comparator 702 based on the received comparator output signal 704 from the comparator 700.

In the present embodiment, the controller 410 comprises an RC circuit 800 comprising a first capacitor 802 and a resistor 804 and having an RC time constant. The first capacitor 802 and the resistor 804 are coupled in parallel. The controller 410 is configured to discharge the RC circuit 800 over a discharge time when the comparator output signal 704 from the comparator 700 transitions from a low state to a high state. The discharge time of the RC circuit 800 is dependent on the RC time constant and the comparator 702 is disabled when the RC circuit 800 is sufficiently discharged.

The controller 410 further comprises an inverter 806 and a diode 808. The resistor 804 comprises a first terminal coupled to a supply voltage VS2 and a second terminal coupled to an input of the inverter 806 at a controller node 810. The inverter 806 comprises an output coupled to a power terminal of the comparator 702 for enabling or disabling the comparator 702. The diode 808 comprises a first terminal coupled to the controller node 810 and a second terminal coupled to an output of the comparator 700. The comparator output signal 704 of the comparator 700 is provided at the output of the comparator 700.

The diode 808 is coupled to the controller node 810 and to the output of the comparator 700 in such a way that when the diode 808 is forward biased the first terminal is a cathode and the second terminal is an anode.

In operation, the comparator 700 is always enabled, whereas the comparator 702 is only enabled when the control signal 710 is high and disabled when the control signal 710 is low. In the present embodiment, the controller 410 only enables/disables the comparator 702, and not the comparator 700.

Figure 9A:
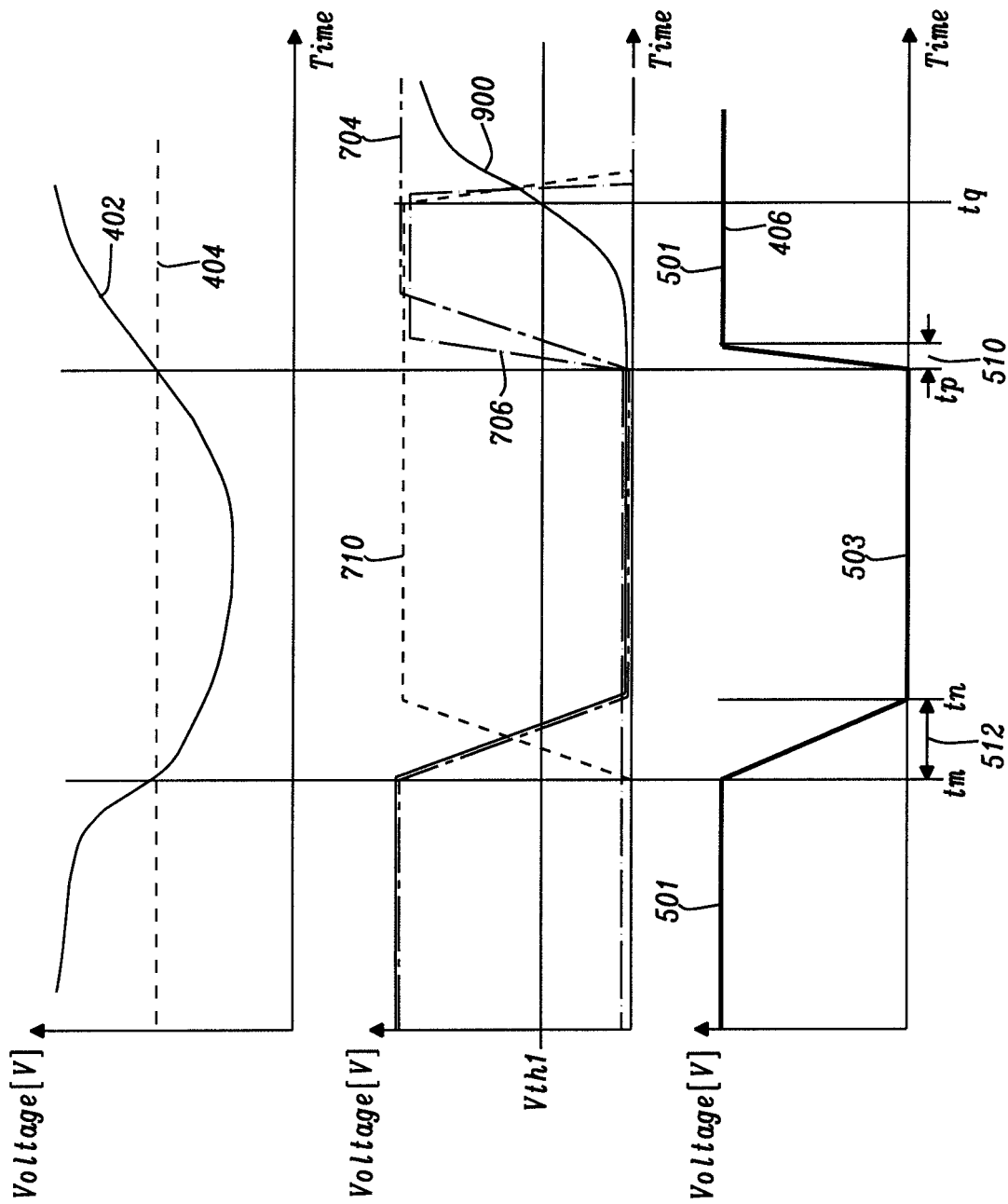
FIG. 9A is a timing diagram showing the operation of an embodiment of the comparator system as shown in FIG. 8.

FIG. 9A is a timing diagram showing the operation of an embodiment of the comparator system 400 as shown in FIG. 8. FIG. 9A shows various signals associated with the comparator system 400 of FIG. 8 as they vary with time.

Reference numerals used in FIG. 9A to denote these signals are used to denote the same signals in FIG. 8. Also shown is a node voltage 900 at the controller node 810. As discussed previously, the rising and falling delay times have been omitted to aid in the clarity of the drawings and in a physical implementation of the comparator system 400 the rising output delay will comprise the rise time and the rising delay time, and the falling output delay will comprise the fall time and the falling delay time.

The system output signal 406 displays the same transitioning characteristics as described for FIG. 5B, and therefore shows an asymmetrical performance. The system output signal 406 transitions from the high state 501 to the low state 503 in the falling output delay 512, and transitions from the low state 503 to the high state 501 in the rising output delay 510, where the rising output delay 510 is faster than the falling output delay 512.

Prior to a time tm the input signal 402 is larger than the reference signal 404 and the comparator output signal 704 is high. This causes the controller node 810 to be high (the node voltage 900 is high), which causes the output of the inverter 806 (the control signal 710) to be low, which disables the comparator 702. The comparator output signal 706 is low because the comparator 702 is disabled. The output of the OR gate 712 is the OR of the comparator output signals 704, 706, which in this case is high. Prior to the time tm, the system output signal 406 is in the high state 501 because the comparator output signal 704 is high.

As discussed previously, a signal being high (which may be in reference to the signal being in the high state) may be in reference to the signal being at a high voltage. A signal being low (which may be referred to as the signal being in the low state), may correspond to the signal being at a low voltage, where the low voltage is less than the high voltage. The low voltage may correspond to zero volts, or ground.

Between the time tm and a time tp, the input signal 402 is lower than the reference signal 404. The comparator output signal 704 transitions from high to low in the falling output delay 512. The node voltage 900 transition from high to low, which results in the control signal 710 transitioning from low to high; the comparator 702 is enabled when the control signal 710 is high. The comparator 702 is enabled at a time tn, but the comparator output signal 706 remains low whilst the input signal 402 is lower than the reference signal 404. When the comparator output signals 704, 706 are low, the system output signal 406 is in the low state 503.

At the time tp, the input signal 402 rises above the reference voltage 404. The comparator output signal 706 transitions from low to high in the rising output delay 510. The system output signal 406 also transitions from the low state 503 to the high state 501 in the rising output delay 510. The comparator output signal 704 transitions from low to high in a time period that is longer than the rising output delay 510. When the comparator output signal 704 reaches the high state, the diode 808 becomes reverse biased causing the RC circuit 804 to discharge. This causes the node voltage 900 to rise and when the node voltage 900 reaches a threshold value Vth1 at a time tq, causes the control signal 710 to transition from high to low. The comparator 702 is then disabled and the comparator output signal 706 transitions from high to low; the diode 808 becomes forward biased. After the time tq, the system output signal 406 remains in the high state 501 because the comparator output signal 704 is still high. The process as described may then repeat, as will be clear to the skilled person.

The controller 410 is configured to provide a high control signal 710 and enable the comparator 702 during a time period when a transition from the low state to the high state may occur (for example, between the time tn and the time tq).

An RC time constant of the RC circuit 804, which is used to set the time it takes to disable the comparator 702, can be optimized for the specific operating parameters of a given system. This allows for the optimization of operating power versus system performance.

Since the comparator 702 is only activated during periods of time when a low to high state transition of the system output signal 406 might happen, this mode of operation achieves a significant reduction of power consumption without affecting the performance of the higher-level circuit, for a practical implementation of the system.

A time constant of the RC circuit 808 determines the time taken for the controller 410 to disable the comparator 702 and can be tailored to satisfy the requirements of the higher-lever circuit which the comparator system 400 may be embedded within or configured to be coupled to, thereby allowing optimal power consumption and performance conditions.

Figure 9B:
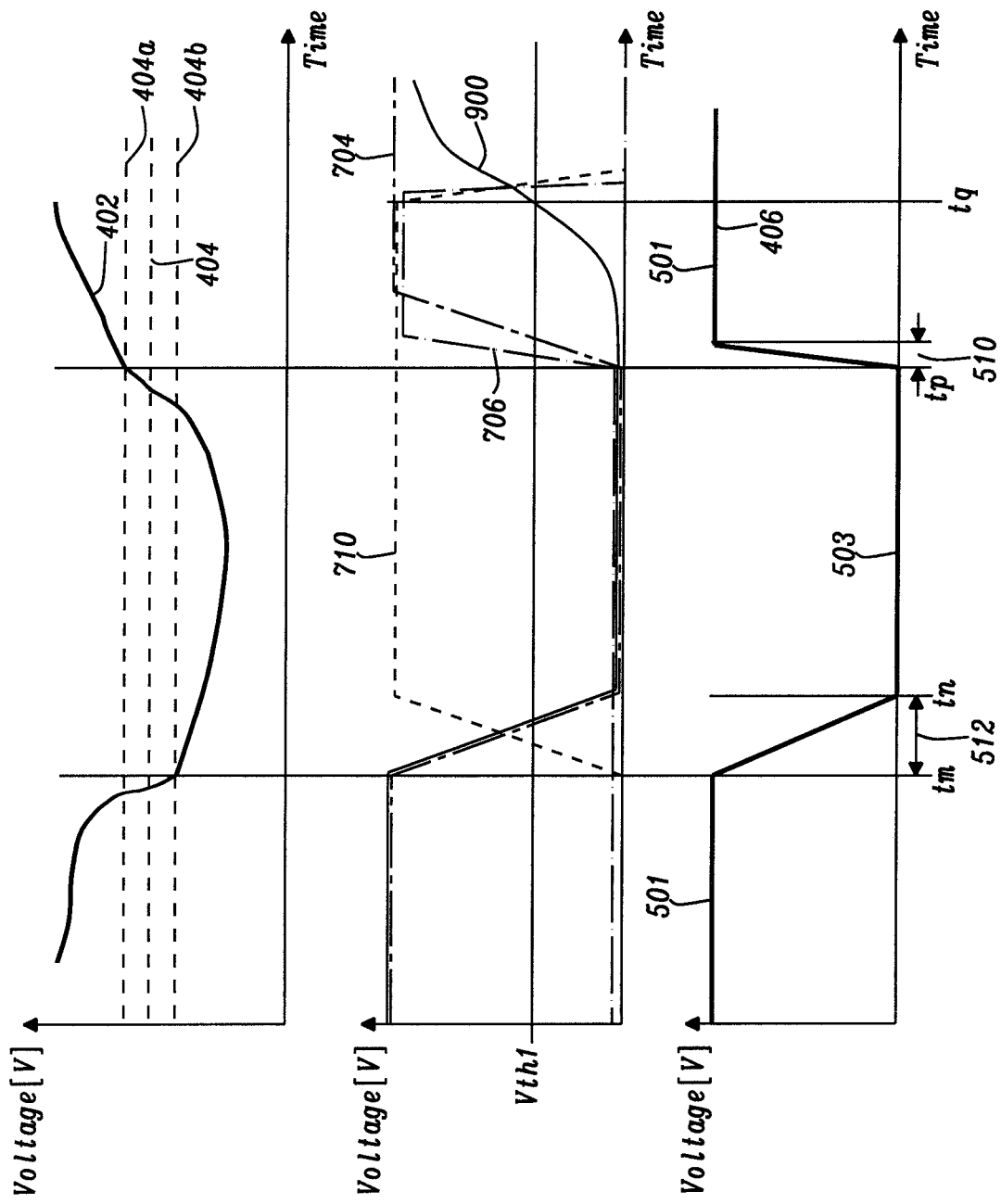
FIG. 9B is a timing diagram showing the operation of a further embodiment of the comparator system as shown in FIG. 8.

FIG. 9B is a timing diagram of a further embodiment of the comparator system 400 as shown in FIG. 8, where the comparator system 400 exhibits hysteresis. FIG. 9B shows various signals associated with the comparator system 400 of FIG. 8 as they vary with time. As discussed previously, the rising and falling delay times have been omitted to aid in the clarity of the drawings and in a physical implementation of the comparator system 400 the rising output delay will comprise the rise time and the rising delay time, and the falling output delay will comprise the fall time and the falling delay time.

The operation of the comparator system 400 as shown for FIG. 9B is substantially as described for FIG. 9A, however in FIG. 9B, the system output signal 406 transitions from the high state 501 to the low state 503 when the input signal 402 crosses from greater than, to less than, a lower threshold 404b (as shown at time tm) and the system output signal 406 transitions from the low state 503 to the high state 501 when the input signal 402 crosses from less than, to greater than, an upper threshold 404a. In the present embodiment, the reference signal 404 is a reference voltage Vref, the upper threshold 404a is equal to Vref+Vhyst/2, and the lower threshold 404b is equal to Vref−Vhyst/2, where Vhyst is a hysteretic voltage, that is a constant voltage value.

It will be appreciated that different implementations of the controller 410 are possible. Furthermore, it will be appreciated that the controller 410 as implemented in the embodiments of FIG. 9A and FIG. 9B are designed to have a fixed RC constant so that the comparator system 400 has a fixed response pattern, i.e. it always operates with a fast rising output delay and a slower falling output delay. However different configurations are possible, that may or may not drive the comparator system 400 to operate with a response pattern that varies throughout operation.

Figure 10A:
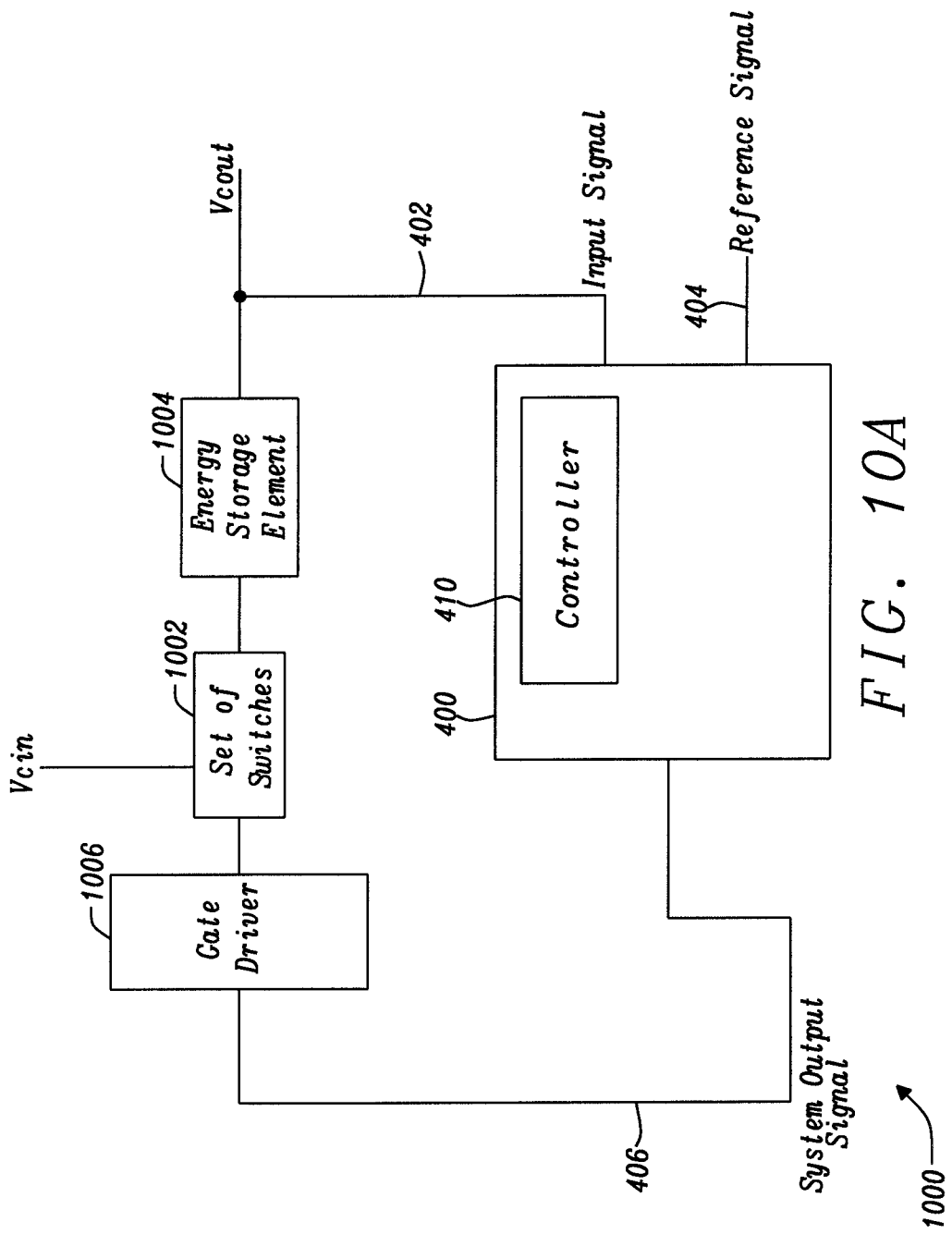
FIG. 10A is a schematic of a switching converter comprising the comparator system in accordance with a twelfth embodiment of the present disclosure.

The comparator system 400 may be used to improve the efficiency of switching converters, for example, at light loads. FIG. 10A is a schematic of a switching converter 1000 comprising the comparator system 400 in accordance with a twelfth embodiment of the present disclosure. The comparator system 400 implemented as part of the switching converter 1000 may correspond to any of the embodiments of the comparator system 400 as described, or any other embodiments of the comparator system 400 featuring modifications in accordance with the understanding of the skilled person and within the scope of the present disclosure.

It will be appreciated that the switching converter 1000 may be considered as a specific embodiment of the comparator system 400 being implemented in a higher-level system (such as the electrical circuit 606 shown in FIG. 6C).

The switching converter 1000 is suitable for receiving a converter input voltage Vcin and providing a converter output voltage Vcout. The converter output voltage Vcout of switching converter 1000 may be used to drive a load. The switching converter 1000 comprises a set of switches 1002 comprising one or more switches, an energy storage element 1004 configured to convert the converter input voltage Vcin to the converter output voltage Vcout by a switching operation of the set of switches 1002 and a gate driver 1006 configured to control the switching operation of the set of switches 1002 by selectively switching the, or each, switch between an open state and a closed state. The energy storage element 1004 may, for example, be an inductor. The gate driver 1006 may be a hysteretic controller. The, or each, switch may be implemented using a transistor. The open state corresponds to the case where a switch is "off" and therefore restricts the flow of current. The closed state corresponds to the case where a switch is "on" and therefore permits the flow of current.

The switching converter 1000 further comprises the comparator system 400 for comparing the input signal 402 and the reference signal 404 as previously described. In the present embodiment, the input signal 402 provided to the comparator system 400 is the converter output voltage Vcout of the switching converter 1000. The system output signal 406 is provided to the gate driver 1006.

The system output signal 406 may be used to enable or disable the gate driver 1006. When the gate driver 1006 is enabled it switches the set of switches 1002 between open and closed states as described previously. When the gate driver 1006 is disabled, the switching operation of the set of switches 1002 may be halted.

Alternatively, the switching operation of the set of switches may be dependent on the system output signal 406 provided to the gate driver 1006. For example, the transitioning of the system output signal 406 may be used to control the switching transitions of the set of switches 1002.

Figure 10B:
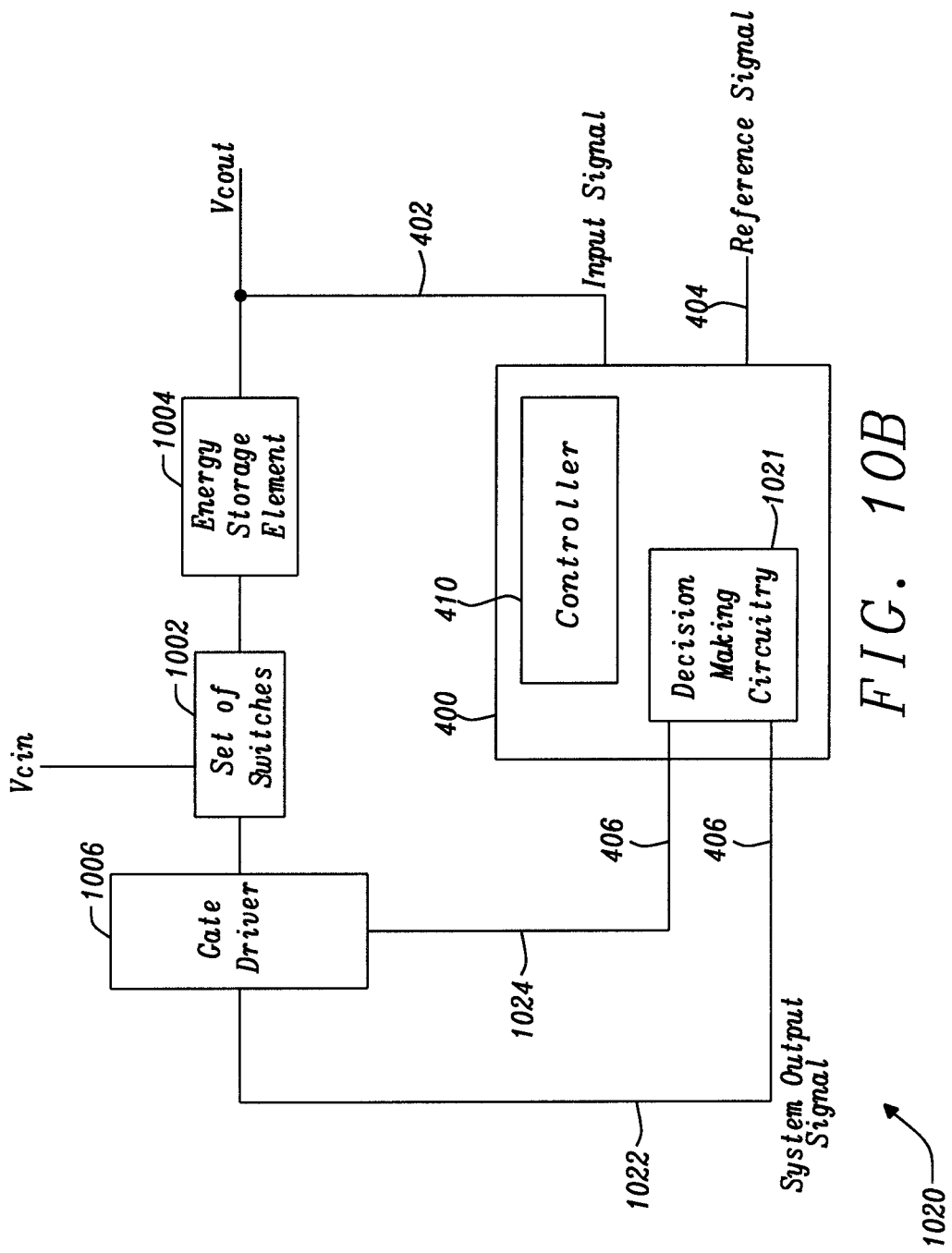
FIG. 10B is a schematic of a switching converter comprising the comparator system in accordance with a thirteenth embodiment of the present disclosure.

In a further embodiment the system output signal 406 may be able to provide both of these functionalities. FIG. 10B is a schematic of a switching converter 1020 comprising the comparator system 400 in accordance with a thirteenth embodiment of the present disclosure. The switching converter 1020 corresponds to the switching converter 1000 and therefore common reference numerals represent common features. However, in the present embodiment the comparator system 400 comprises decision making circuitry 1021 for receiving the system output signal 406 and passing the system output signal 406 to the gate driver via one of two wires 1022, 1024. In a first mode, the decision making circuitry 1021 may provide the system output signal 406 to the gate driver circuit 1006 via the wire 1022, where the system output signal 406 is used to enable or disable the gate driver circuit 1006. In a second mode, the decision making circuitry 1021 may provide the system output signal 406 to the gate driver circuit 1006 via the wire 1024 to provide a control signal to control the switching operation of the set of switches 1002.

It will be appreciated that the system output signal 406 may be provided by both wires 1022, 1024 simultaneously, for example to both enable the gate driver circuit 1006 and to control the set of switches 1002. Alternatively, the system output signal 406 may be provided to the gate driver circuit 1006 by a single wire with decision making circuitry being external to the comparator system 400 and either as part of the gate driver circuit 1006 or external to the gate driver circuit 1006.

It will be appreciated that in a further embodiment, the comparator system 400 having the decision making circuitry 1021 may be implemented as a standalone component that is implemented independently of the switching converter 1020 or as part of another system.

In a further embodiment, the system output signal 406 may undergo further processing prior to providing the system output signal 406 to control the switching operation of the set of switches 1002.

Figure 10C:
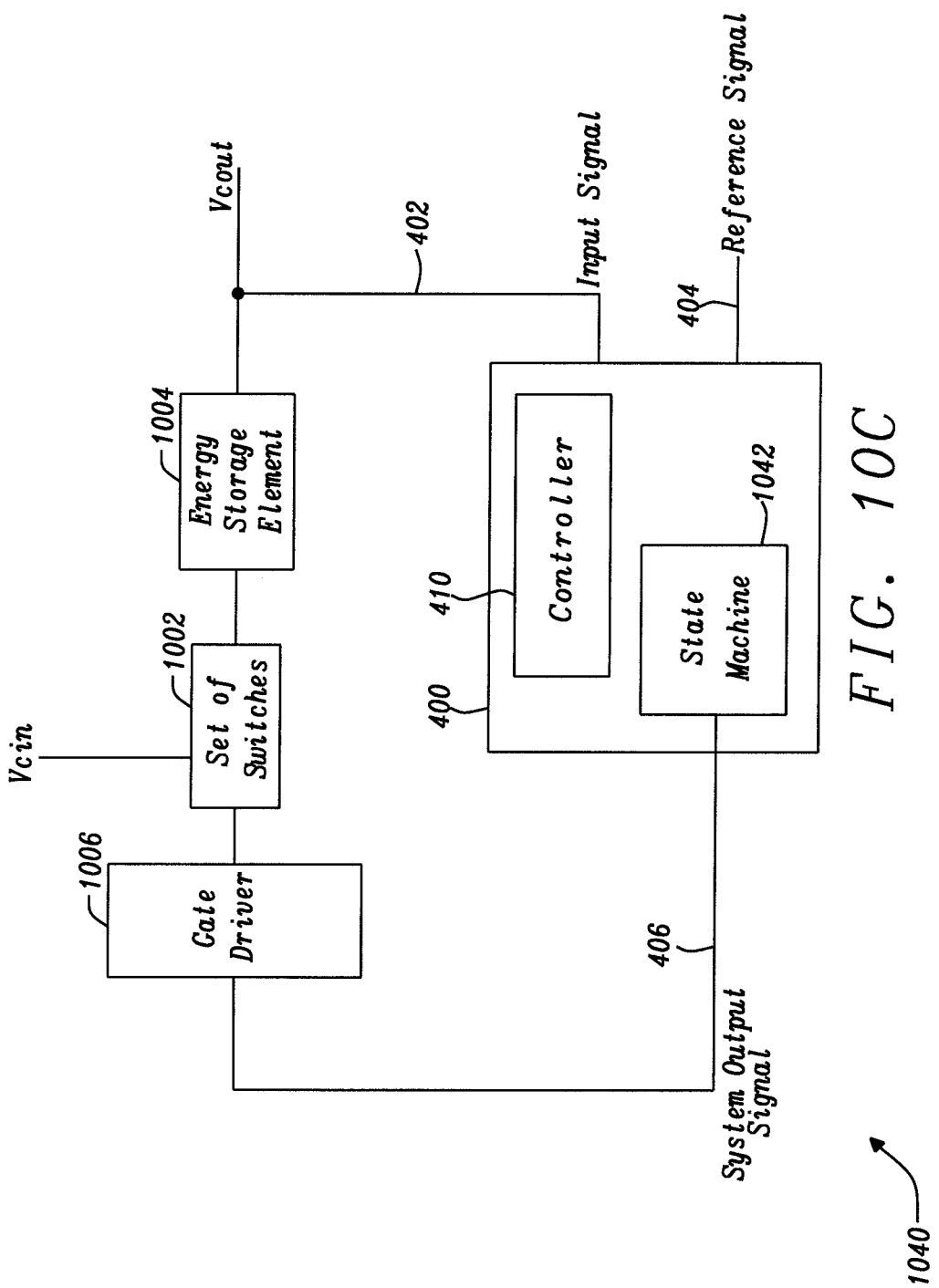
FIG. 10C is a schematic of a switching converter comprising the comparator system in accordance with a fourteenth embodiment of the present disclosure.

FIG. 10C is a schematic of a switching converter 1040 in accordance with a fourteenth embodiment of the present disclosure. In the present embodiment, the comparator system 400 comprises a state machine 1042, configured to receive the system output signal 406 and to process and output the system output signal 406 based on the history of the comparator system's 400 or the switching converter's 1040 operation.

It will be appreciated that in a further embodiment, the comparator system 400 having the state machine 1042 may be implemented as a standalone component that is implemented independently of the switching converter 1040 or as part of another system.

Figure 11:
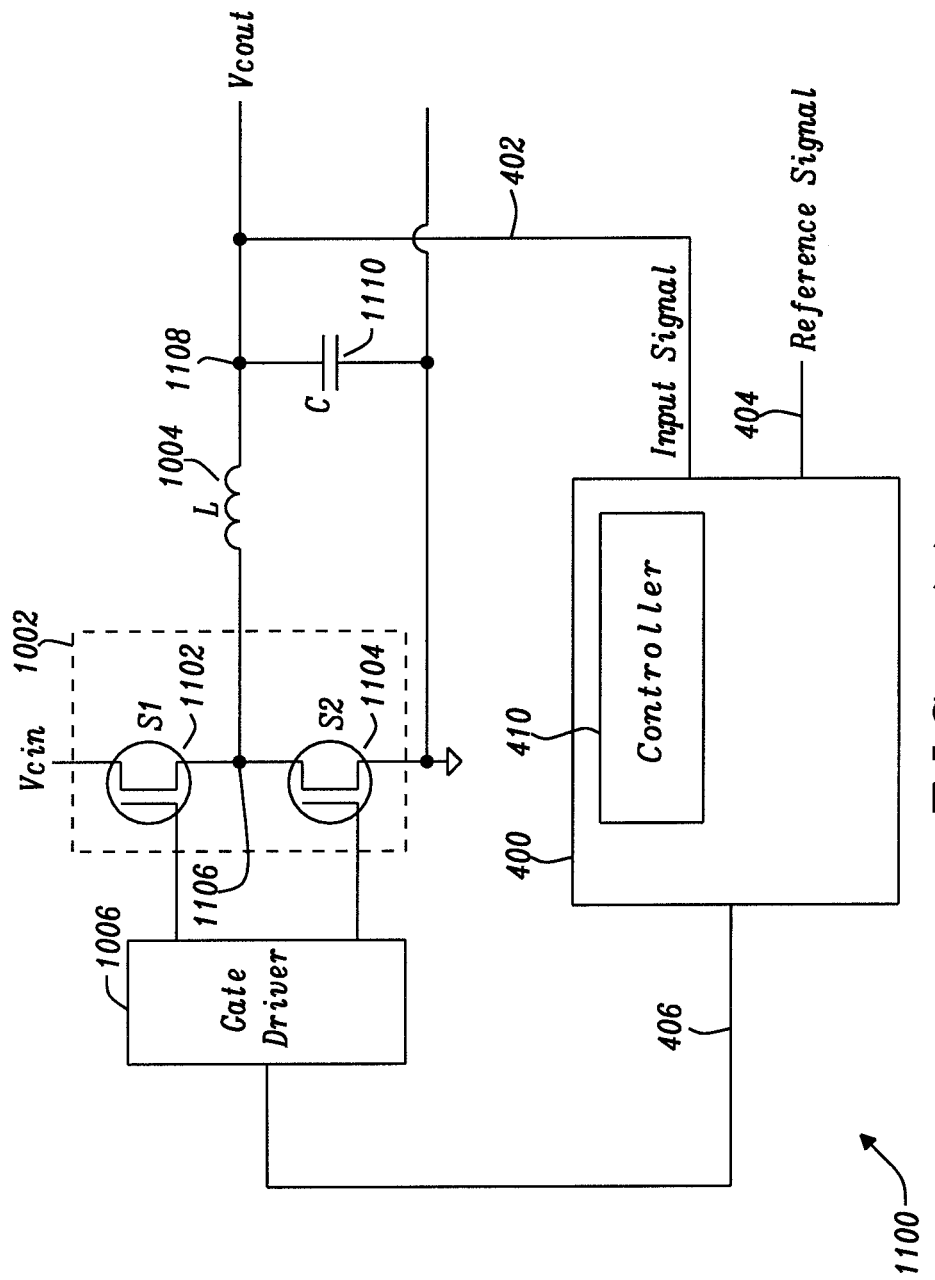
FIG. 11 is a schematic of a switching converter comprising the comparator system in accordance with a fifteenth embodiment of the present disclosure.

FIG. 11 is a schematic of a switching converter 1100 comprising the comparator system 400 in accordance with a fifteenth embodiment of the present disclosure. The switching converter 1100 is a specific embodiment of the switching converter 1000 as previously described and therefore common reference numerals between different Figures denote common features. In the present embodiment the switching converter 1100 is a buck converter and the energy storage element 1004 is an inductor. It will be appreciated that in further embodiments, the switching converter 1100 may be another type of switching converter in accordance with the understanding of the skilled person. For example, the switching converter 1000 may alternatively be a boost converter, a buck-boost converter, or a capacitive converter. In the case of a capacitive converter the energy storage element 1004 will be a capacitor, rather than an inductor.

The set of switches 1002 comprises a first and second switch 1102, 1104. It will be appreciated that in further embodiments, the set of switches 1002 may comprise only a single switch. The first switch 1102, the second switch 1104 and the energy storage element 1004 are configured to convert the converter input voltage Vcin to the converter output voltage Vcout by the switching operation of the first switch 1102 and the switching operation of the second switch 1104. The gate driver 1006 is configured to control the switching operation of the first and second switches 1102, 1104 by selectively switching the switches 1102, 1104 between an open state and a closed state. The gate driver 1006 may be enabled or disabled based on the system output signal 406 provided to the gate driver 1006 as discussed previously. The switching operation of the switches 1102, 1104 may be dependent on the system output signal 406 provided to the gate driver 1006, as discussed previously.

A first terminal of the first switch 1102, a first terminal of the second switch 1104 and a first terminal of the inductor 1004 are coupled at an inductor node 1106. A second terminal of the first switch 1102 is coupled to converter input voltage Vcin, a second terminal of the second switch 1104 is coupled to ground, and a second terminal of the inductor 1004 is coupled to an output node 1108. The converter output voltage Vcout is provided at the output node 1108. In the present embodiment, the switching converter 1100 comprises an output capacitor 1110 coupled to the output node 1008.

During operation, when the gate driver 1006 is enabled, the switches 1102, 1104 are alternately switched between open and closed states. For example, when the switch 1102 is open, the switch 1104 is closed, and when the switch 1102 is closed, the switch 1104 is open. When the gate driver 1006 is disabled, the switches 1102, 1104 may be tri-stated, where both switches are open.

The switching converter 1000 is a hysteretic converter and the gate driver 1006 is a hysteretic controller when the comparator system 400 exhibits hysteresis.

Figure 12:
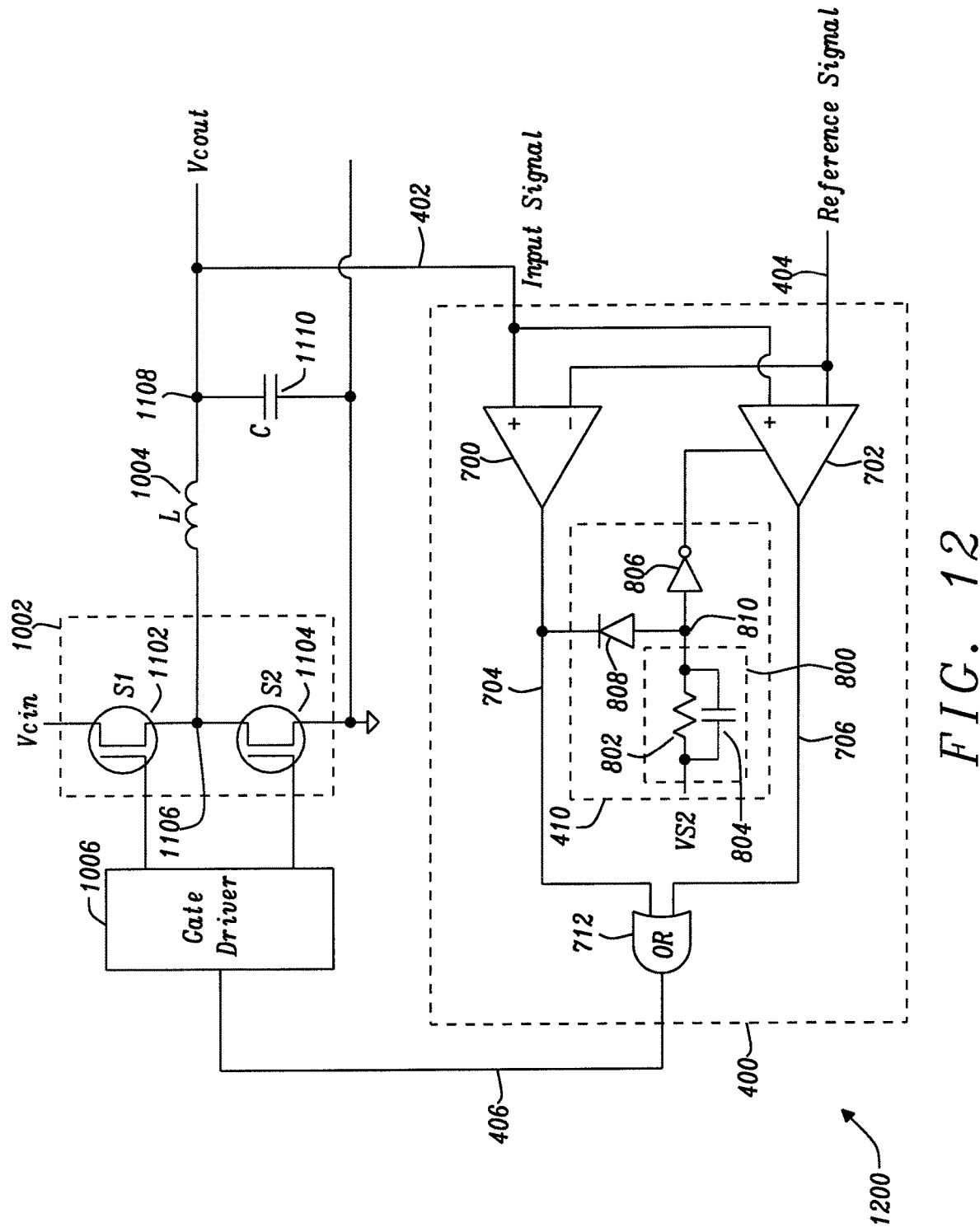
FIG. 12 is a schematic of a switching converter comprising the comparator system in accordance with a sixteenth embodiment of the present disclosure.

FIG. 12 is a schematic of a switching converter 1200 comprising the comparator system 400 in accordance with a sixteenth embodiment of the present disclosure. In the present embodiment, the comparator system 400 is implemented as shown in FIG. 8. Common features between Figures share common reference numerals and variables. The supply voltage VS2 may be the same as the converter input voltage Vcin. At least one of the comparators 700, 702 may be a hysteretic comparator. In the present embodiment, both comparators 700, 702 are hysteretic comparators and therefore the comparator system 400 functions as a hysteretic comparator system that uses a different threshold voltage depending on whether the system output signal 406 is transitioning from the low state to the high state or from the high state to the low state. As the comparator system 400 functions as a hysteretic comparator system, the switching converter 1200 may be referred to as a hysteretic buck converter.

Figure 13A:
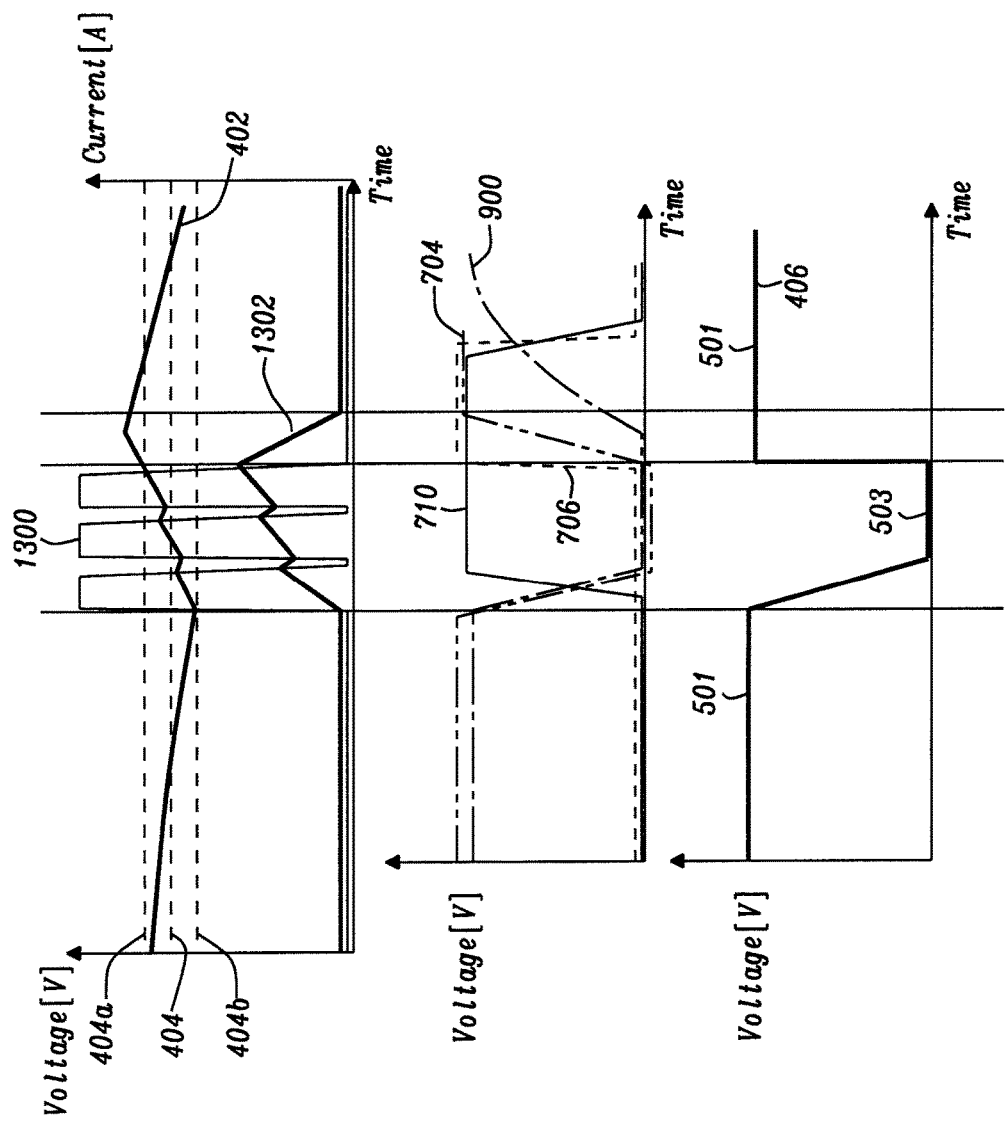
FIG. 13A is a timing diagram showing the operation of the switching converter of FIG. 12.

FIG. 13A is a timing diagram showing the operation of the switching converter 1200 of FIG. 12. FIG. 12 shows various signals associated with the switching converter of FIG. 12 as they vary with time. Reference numerals used in FIG. 13A to denote these signals are used to denote the same signals in FIG. 12. Also shown is the node voltage 900 at the controller node 810, as previously described in FIGS. 9A and 9B, an inductor voltage 1300 at the inductor node 1106, and an inductor current 1302 corresponding to a current flowing through the inductor 1004. The comparator system 400 functions substantially as described in FIGS. 9A and 9B, however in the present embodiment, the input signal 402 is provided by the converter output voltage Vcout. As discussed previously, the rising and falling delay times have been omitted to aid in the clarity of the drawings and in a physical implementation of the comparator system 400 the rising output delay will comprise the rise time and the rising delay time, and the falling output delay will comprise the fall time and the falling delay time.

Additionally, in the present embodiment, the comparator system 400 functions as a hysteretic comparator system as previously described in FIG. 9B. Therefore the reference signal 404 is used to provide the upper threshold 404a and the lower threshold 404b that the input signal 402 is compared to, depending on whether the system output signal 406 is in the high or low state. In the present embodiment, the reference signal 404 is the reference voltage Vref, the upper threshold 404a is equal to Vref+Vhyst/2, and the lower threshold 404b is equal to Vref−Vhyst/2, where Vhyst is the hysteretic voltage, that is a constant voltage value.

During the switching operation of the switching converter 1200, the inductor voltage 1300 alternates between a high state and a low state depending on whether the switches 1102,1104 are closed or open. When the inductor voltage 1300 is high, the switching converter 1200 transfers energy from the converter input voltage Vcin to the inductor 1004.

The converter input voltage Vcin may be provided by a battery or a power supply connection. When the inductor voltage 1300 is low, the switching converter 1300 transfers energy from the inductor 1004 to the capacitor 1110, which is connected to the load. The inductor current 1302 and the converter output voltage Vcout (shown in FIG. 13A as the input signal 402) increase and decrease accordingly.

At light loads, the power transfer of the switching converter 1200 can be divided in three phases. With reference to FIG. 13A, a first phase is from a time tr to a time ts, a second phase is from the time ts to a time tt. Prior to the time tr, the system output signal 406 is in the high state and the gate driver 1006 is disabled. The first phase is entered when the system output signal 406 enters the low state and the gate driver 1006 is enabled. In the first phase, the switching converter 1200 accumulates energy in the inductor 1004, which may be chosen to be able to store the required amount of energy in a short time. The first phase is the switching operation as described previously and continues until the converter output voltage Vcout rises above the upper threshold 404a, causing the system output signal 406 of the comparator system 400 to transition to the high state and disable the gate driver 1006. In the second phase the switching operation is stopped and the switching converter 1200 transfers all the energy stored in the inductor 1004 to the capacitor 1110. After the time tt, the half-bridge is tristated and the load slowly drains the capacitor 1110, and the converter output voltage Vcout (the input signal 402) will eventually fall below the lower threshold 404b causing the system output signal 406 of the comparator system 400 to transition to the low state and enable the gate driver 1110, thus restarting the first phase. The third phase refers to the time where there is no inductor current 1302.

After the time tt and before restarting the first phase, the comparator system 400 can be slow, whereas in the first phase it needs to be fast. Additionally, during the time between tt and restarting the first phase, power consumption mainly occurs in the comparator system 400, and this strongly impacts efficiency. By using the slower of the two comparators 700, 702 in this step there may be provided low ripple and stability result in a significant improvement in the overall efficiency.

Figure 13B:
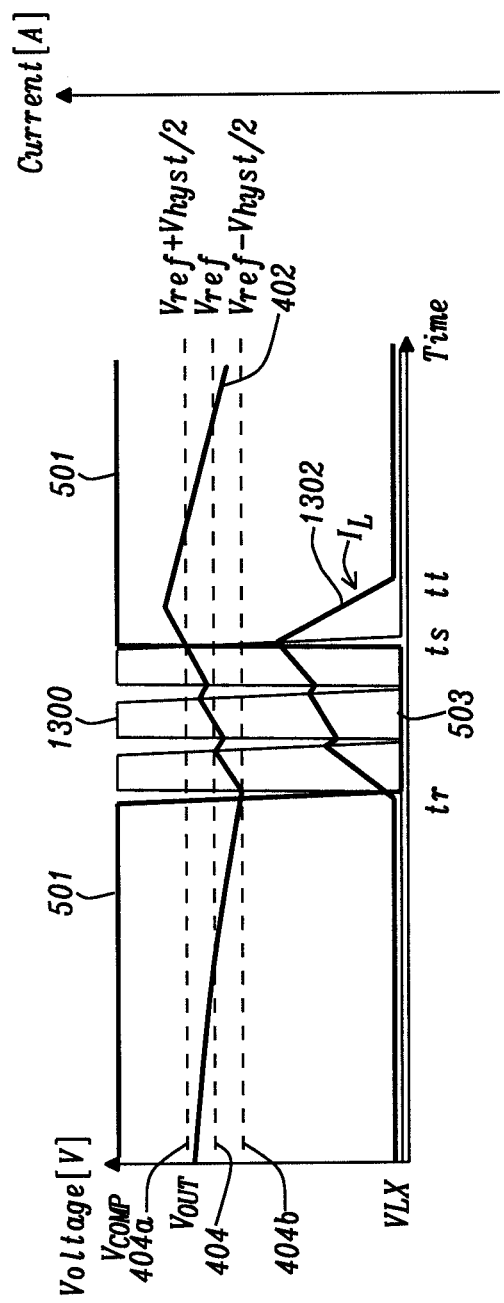
FIG. 13B is another timing diagram showing the operation of the switching converter of FIG. 12.

FIG. 13B is a timing diagram showing the operation of the switching converter 1200 of FIG. 12. The timing diagram is an alternative representation of some of the signals/traces shown in FIG. 13A and therefore common features are represented by common reference numerals and variables. As discussed previously, the rising and falling delay times have been omitted to aid in the clarity of the drawings and in a physical implementation of the comparator system 400 the rising output delay will comprise the rise time and the rising delay time, and the falling output delay will comprise the fall time and the falling delay time.

Figure 1:
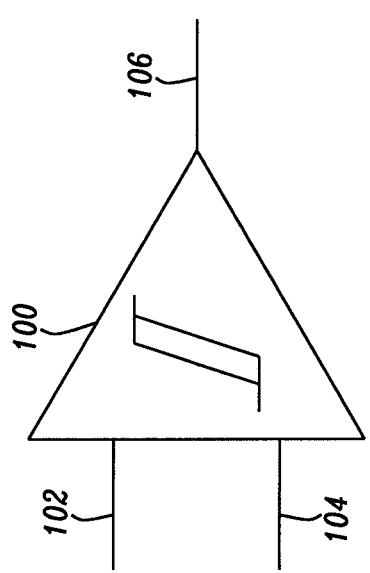
FIG. 1 is a schematic of a comparator in accordance with the prior art.
Figure 2A:
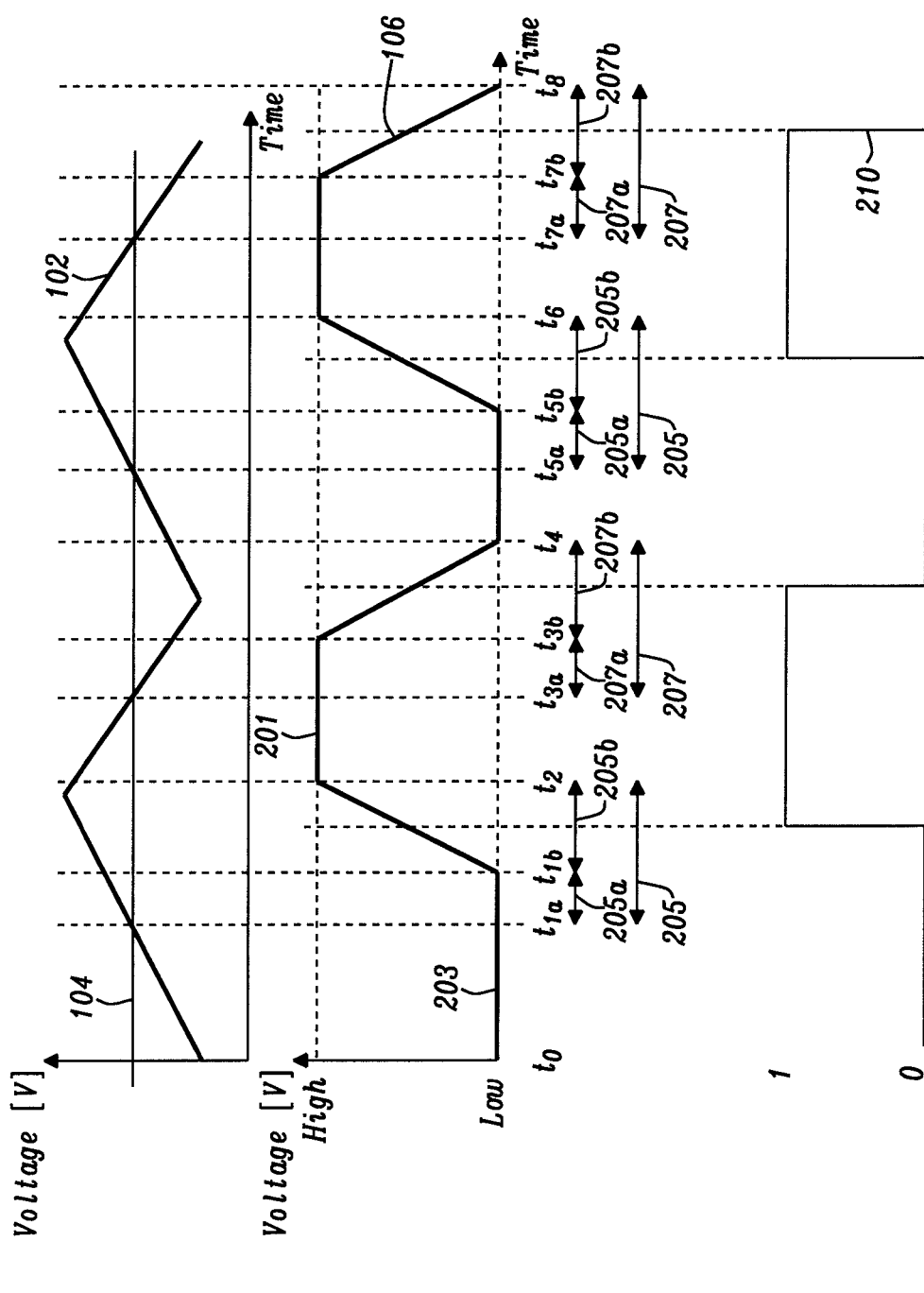
FIG. 2A is a timing diagram showing the operation of the comparator of FIG. 1
Figure 2B:
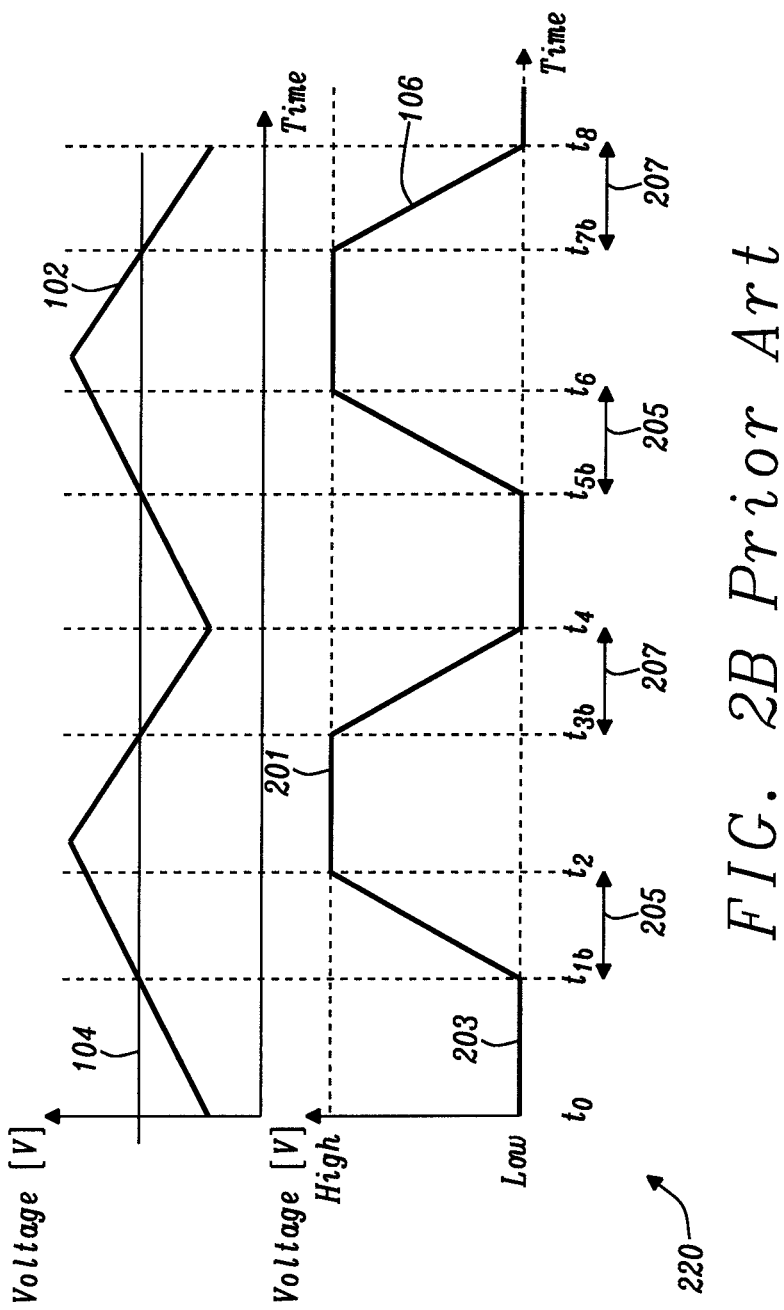
FIG. 2B is a further timing diagram showing the operation of the comparator of FIG. 1.
Figure 3:
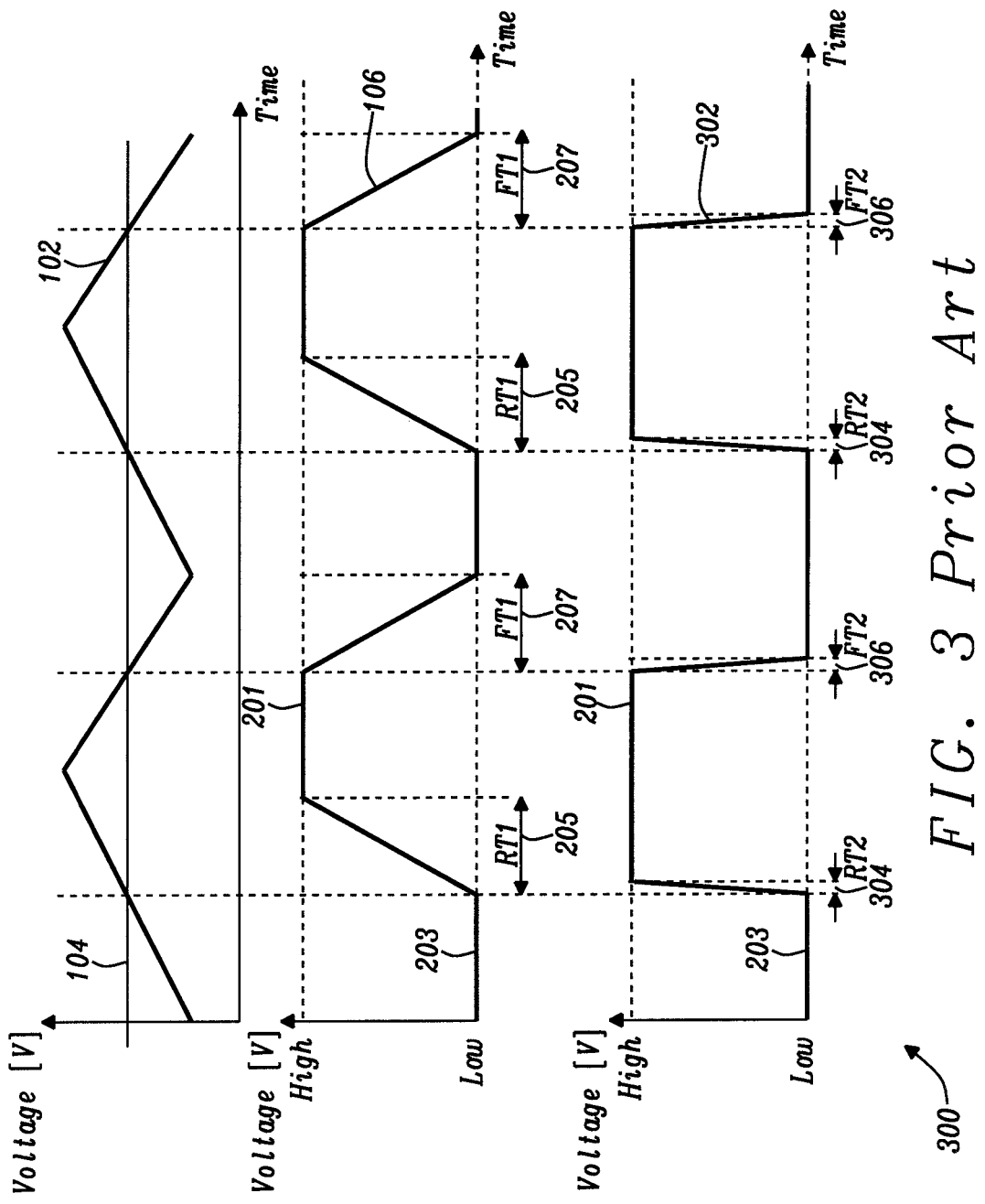
FIG. 3 is a timing diagram showing the operation of the comparator of FIG. 1 and another comparator.

In a prior art switching converter, where a comparator of the type shown in FIG. 1 (the comparator 100) is implemented in place of the comparator system 400, the response time of the comparator 100 is not instantaneous and the output voltage 106 transitions between the low and the high state over a finite interval. Therefore, the gate driver 1006, and in turn the switching operation, are enabled and disabled with a small delay. If the first phase, in which the energy is accumulated in the inductor 1004 is not terminated at the correct time and/or a delay causes the charging of the inductor 1004 to continue beyond the desired time, then an excess amount of energy will be stored in the inductor 1004. When transferred to the output capacitor 1110, this excess energy can cause an increased ripple, instability and loss of efficiency. Hence, the disabling of the gate driver 1006 at the time ts is preferably done with minimal delay. This could be achieved by using a comparator with faster response time. However, since the enabling of the gate driver 1006 at the time tr can tolerate some delay, using a comparator that has a fast response for both the transition from the low to the high state and the transition from the high to the low state, would result in an increase in power consumption compared with the slower comparator. Therefore, use of the comparator system 400 of the present disclosure enables a fast transition when required, whilst using a slower transition when it is not required, thereby resulting in overall power savings when implemented in a switching converter. Disabling of the gate driver 1006 is more sensitive to delay than the enabling of the gate driver 1006.

By making use of the comparator system 400, the gate driver 1006 can achieve fast disabling and slower enabling of the switching operation of the switches 1102, 1104 as required, while maintaining an optimal power consumption. Power converters according to the present disclosure will therefore have lower native ripple and will be able to operate at faster speed than existing power converters of similar performance, thereby reducing the size and cost for external components. Additionally, comparator systems 400 as described herein may be used to optimise a switching converter for different goals, e.g. ripple or load transient optimised, or a low power mode.

Comparator systems as disclosed herein enable rising and falling output delays of the system output signal to be adjusted, depending on the requirements on an external system using the comparator system or based on user-defined parameters. The rising and/or falling output delays may be controlled to be fast or slow, depending on the requirements of a given application. Therefore the comparator systems of the present disclosure can provide fast system output signal transitions when needed, whilst still providing an overall reduction in power consumption when compared to the prior art.

Various improvements and modifications may be made to the above without departing from the scope of the disclosure.

What is claimed is:

1. A comparator system for comparing an input signal and a reference signal, comprising:
   a controller configured to adjust a rising output delay and/or a falling output delay of a system output signal; wherein:
   the system output signal is dependent on the comparison between the input signal and the reference signal;
   wherein said comparator system comprises a plurality of comparators, wherein:
   each comparator is configured to:
     i) receive the input signal and the reference signal; and
     ii) provide a comparator output signal wherein each of the comparator output signals have different rising output delays and/or falling output delays;
   the controller is configured to adjust the rising output delay and/or falling output delay of the system output signal by selectively enabling or disabling at least one of the comparators; and
   the system output signal comprises the comparator output signal provided by a comparator that is enabled.

2. The comparator system of claim 1, wherein:
   the system output signal comprises a high state and a low state;
   the rising output delay comprises a rising delay time and a rise time;

the falling output delay comprises a falling delay time and a fall time;

the rising delay time is a time taken from the comparison between the input signal and the reference signal triggering a low-to-high transition of the system output signal from the low state to the high state until the low-to-high transition begins;

the rise time is a time taken for the system output signal to transition from the low state to the high state from the beginning of the low-to-high transition;

the falling delay time is a time taken from the comparison between the input signal and the reference signal triggering a high-to-low transition of the system output signal from the high state to the low state until the high-to-low transition begins; and the fall time is a time taken for the system output signal to transition from the high state to the low state from the beginning of the high-to-low transition.

3. The comparator system of claim 1, wherein:
the rising output delay is the sum of the rising delay time and the rise time; and
the falling output delay is the sum of the falling delay time and the fall time.

4. The comparator system of claim 1, wherein the controller is configured to adjust the rising output delay and the falling output delay of the system output signal such that:
   i) the rising output delay is less than the falling output delay; or
   ii) the falling output delay is less than the rising output delay; or
   iii) the rising output delay and the falling output delay are equal.

5. The comparator system of claim 1, wherein the controller is configured to adjust the rising output delay and/or the falling output delay of the system output signal based on a signal received from one of:
   i) a memory element configured to store data related to the rising output delay and/or the falling output delay of the system output signal, wherein the signal received from the memory element is dependent on the data stored within the memory element; or
   ii) at least a portion of an electrical circuit, wherein the signal received by the controller is dependent on one or more requirements of the at least a portion of the electrical circuit.

6. The comparator system of claim 5, wherein:
the controller is configured to adjust the rising output delay and/or the falling output delay of the system output signal based on the signal received from the at least a portion of the electrical circuit; and
the comparator system is implemented within the electrical circuit.

7. The comparator system of claim 1 comprising a comparator configured to:
receive the input signal and the reference signal; and
provide the system output signal.

8. The comparator system of claim 7, wherein:
the comparator is coupled to the controller and the controller is configured to adjust the rising output delay and/or the falling output delay of the system output signal.

9. The comparator system of claim 8, wherein:
the controller is configured to adjust the rising output delay and/or the falling output delay of the system output signal by doing at least one of:
adjusting a first supply voltage provided to the comparator;
adjusting a bias current provided to the comparator; and
enabling and/or disabling components of the comparator.

10. The comparator system of claim 7, wherein the comparator is a hysteretic comparator.

11. The comparator system of claim 1 comprising one or more logic gates, wherein:
each of the comparator output signals are provided to the, or each, logic gate; and
the, or each, logic gate outputs the system output signal, such that the system output signal comprises the comparator output signal provided by a comparator that is enabled.

12. The comparator system of the claim 11, wherein the, or each, logic gate is an OR gate.

13. The comparator system of claim 1, wherein at least one of the comparators is a hysteretic comparator.

14. The comparator system of claim 1, wherein the plurality of comparators comprises a first comparator and a second comparator.

15. The comparator system of claim 14, wherein the controller is configured to:
receive the comparator output signal from the first comparator; and
to enable or disable the second comparator based on the received comparator output signal from the first comparator.

16. The comparator system of claim 15, wherein:
the controller comprises an RC circuit comprising a first capacitor and a resistor and having an RC time constant; and
the controller is configured to discharge the RC circuit, a discharge time being dependent on the RC time constant, when the comparator output signal from the first comparator transitions from a low state to a high state; and
the second comparator is disabled when the RC circuit is sufficiently discharged.

17. The comparator system of claim 1, wherein at least one of the input signal, the reference signal and the system output signal are one of a voltage and a current.

18. A switching converter for receiving a converter input voltage and providing a converter output voltage comprising:
a set of switches comprising one or more switches;
an energy storage element configured to convert the converter input voltage to the converter output voltage by a switching operation of the set of switches;
a gate driver configured to control the switching operation of the set of switches by selectively switching the, or each, switch between an open state and a closed state; and
a comparator system for comparing an input signal and a reference signal, comprising:
   a controller configured to adjust a rising output delay and/or a falling output delay of a system output signal; wherein:
   the system output signal is dependent on the comparison between the input signal and the reference signal; wherein:
the input signal provided to the comparator system is the output voltage of the switching converter;
the system output signal is provided to the gate driver; and
the gate driver is enabled or disabled based on the system output signal provided to the gate driver and/or the switching operation of the set of switches is dependent on the system output signal provided to the gate driver;

wherein said comparator system comprises a plurality of comparators, wherein:
  each comparator is configured to:
    i) receive the input signal and the reference signal; and
    ii) provide a comparator output signal wherein each of the comparator output signals have different rising output delays and/or falling output delays;
  the controller is configured to adjust the rising output delay and/or falling output delay of the system output signal by selectively enabling or disabling at least one of the comparators; and
  the system output signal comprises the comparator output signal provided by a comparator that is enabled.

19. The switching converter of claim 18, wherein the set of switches comprises a first switch and a second switch, wherein:
  the first switch, the second switch and the energy storage element are configured to convert the converter input voltage to the converter output voltage by the switching operation of the first switch and the switching operation of the second switch;
  the gate driver is configured to control the switching operation of the first and second switches by selectively switching the first and second switches between an open state and a closed state; and
  the gate driver is enabled or disabled based on the system output signal provided to the gate driver and/or the switching operation of the first and second switches are dependent on the system output signal provided to the gate driver.

20. A method of comparing an input signal and a reference signal using a comparator system comprising a controller, the method comprising:
  adjusting a rising output delay and/or a falling output delay of a system output signal using the controller, wherein the system output signal is dependent on the comparison between the input signal and the reference signal;
wherein said comparator system comprises a plurality of comparators, wherein:
  each comparator is configured to:
    i) receive the input signal and the reference signal; and
    ii) provide a comparator output signal wherein each of the comparator output signals have different rising output delays and/or falling output delays;
  the controller is configured to adjust the rising output delay and/or falling output delay of the system output signal by selectively enabling or disabling at least one of the comparators; and
  the system output signal comprises the comparator output signal provided by a comparator that is enabled.

* * * * *